(12) United States Patent
Yamashita et al.

(10) Patent No.: US 10,411,117 B2
(45) Date of Patent: Sep. 10, 2019

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventors: Hiroaki Yamashita, Ishikawa (JP); Syotaro Ono, Ishikawa (JP); Hisao Ichijo, Ishikawa (JP)

(73) Assignees: Kabushiki Kaisha Toshiba, Tokyo (JP); Toshiba Electronics Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/901,994

(22) Filed: Feb. 22, 2018

(65) Prior Publication Data

US 2019/0109215 A1    Apr. 11, 2019

(30) Foreign Application Priority Data

Oct. 11, 2017    (JP) .................................. 2017-197705

(51) Int. Cl.
*H01L 29/66*    (2006.01)
*H01L 29/78*    (2006.01)
(Continued)

(52) U.S. Cl.
CPC .... *H01L 29/66712* (2013.01); *H01L 29/0634* (2013.01); *H01L 29/0696* (2013.01);
(Continued)

(58) Field of Classification Search
CPC ............ H01L 29/66712; H01L 29/0634; H01L 29/7802; H01L 29/7811; H01L 29/0696;
(Continued)

(56) References Cited

U.S. PATENT DOCUMENTS 9,312,330 B2    4/2016  Takei
2003/0052329 A1*  3/2003  Kobayashi .......... H01L 29/0619
                                              257/135

(Continued)

FOREIGN PATENT DOCUMENTS

JP         4940535 B2      5/2012
JP       2012-156333 A     8/2012
(Continued)

*Primary Examiner* — Marc Anthony Armand
*Assistant Examiner* — Sue Tang
(74) *Attorney, Agent, or Firm* — White & Case LLP

(57) ABSTRACT

A semiconductor device of an embodiment includes a semiconductor layer having a first plane and a second plane, a first semiconductor region of a first conductivity type, a second semiconductor region and a third semiconductor region of a second conductivity type, the first semiconductor region interposed between the third semiconductor region and the second semiconductor region, a first well region of a first conductivity type, a second well region of a first conductivity type separated from the first well region, a first contact region of a first conductivity type, a second contact region of a first conductivity type, a gate electrode provided on the first semiconductor region between the first well region and the second well region, a source electrode having a first region in contact with the first contact region and a second region in contact with the second contact region, and a drain electrode.

4 Claims, 28 Drawing Sheets

(51) Int. Cl.
*H01L 29/06* (2006.01)
*H01L 29/423* (2006.01)
*H01L 29/10* (2006.01)

(52) U.S. Cl.
CPC ...... *H01L 29/4238* (2013.01); *H01L 29/7802* (2013.01); *H01L 29/7813* (2013.01); *H01L 29/1095* (2013.01); *H01L 29/42376* (2013.01)

(58) Field of Classification Search
CPC ........... H01L 29/7827; H01L 29/66666; H01L 29/4236; H01L 29/7813; H01L 21/26513; H01L 21/31111
USPC ......................................................... 257/341
See application file for complete search history.

(56) References Cited

U.S. PATENT DOCUMENTS

| | | | |
|---|---|---|---|
| 2006/0289915 A1* | 12/2006 | Omura | ................ H01L 29/7815 257/296 |
| 2008/0173935 A1* | 7/2008 | Miyajima | ............. H01L 29/866 257/328 |
| 2009/0159927 A1 | 6/2009 | Willmeroth et al. | |
| 2010/0102381 A1 | 4/2010 | Saito et al. | |
| 2012/0074461 A1 | 3/2012 | Ono et al. | |
| 2012/0086076 A1 | 4/2012 | Takei | |
| 2012/0217555 A1 | 8/2012 | Saito et al. | |
| 2015/0115355 A1 | 4/2015 | Hirler et al. | |
| 2016/0118492 A1 | 4/2016 | Asada et al. | |
| 2017/0047321 A1* | 2/2017 | Nishimura | .......... H01L 29/7396 |
| 2017/0263747 A1 | 9/2017 | Ichijo et al. | |

FOREIGN PATENT DOCUMENTS

| | | |
|---|---|---|
| JP | 2013-065782 A | 4/2013 |
| JP | 5423882 B2 | 2/2014 |
| JP | 2017-163112 A | 9/2017 |
| WO | 2011007560 A1 | 1/2011 |

* cited by examiner

Rsp→∞

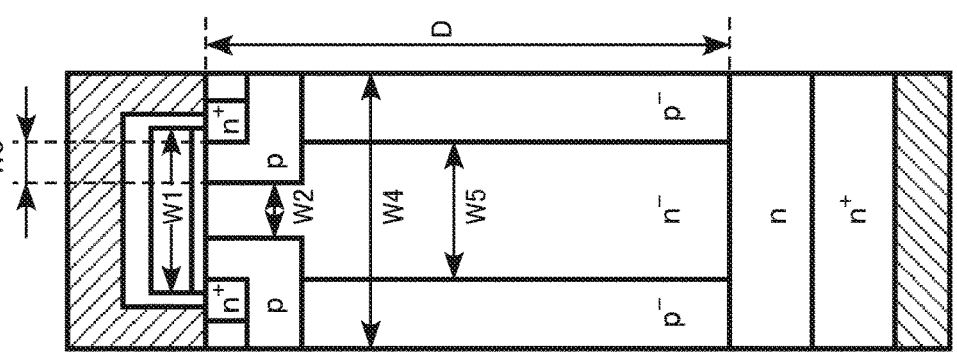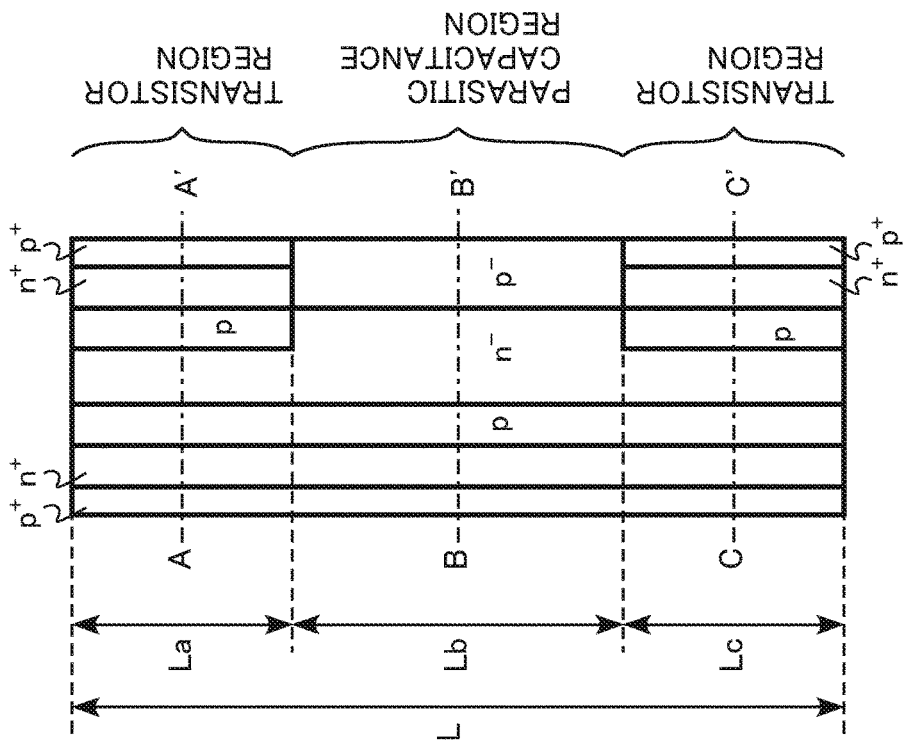

FIG.11

| | PARAMETER | NUMERICAL VALUE | UNIT |
|---|---|---|---|
| TRANSISTOR REGION STRUCTURAL PARAMETER | GATE ELECTRODE WIDTH (W1) | 5 | $\mu m$ |
| | JFET WIDTH (W2) | 3 | $\mu m$ |
| | CHANNEL WIDTH (W3) | 1 | $\mu m$ |
| | PILLAR PITCH (W4) | 8 | $\mu m$ |
| | PILLAR WIDTH (p/n) (W5) | 4 | $\mu m$ |
| | PILLAR DEPTH (p/n) (D) | 50 | $\mu m$ |
| | PILLAR CONCENTRATION (p/n) | 1.0E16 | $cm^{-3}$ |
| PARASITIC CAPACITANCE REGION STRUCTURAL PARAMETER | GATE ELECTRODE WIDTH (Wp1) | 7.5 | $\mu m$ |
| | CHANNEL WIDTH (Wp3) | 1 | $\mu m$ |
| | PILLAR PITCH (Wp4) | 8 | $\mu m$ |
| | PILLAR WIDTH (p/n) (Wp5) | 4 | $\mu m$ |
| | PILLAR DEPTH (p/n) (Dp) | 50 | $\mu m$ |
| | PILLAR CONCENTRATION (p/n) | 1.0E16 | $cm^{-3}$ |
| PHYSICAL PARAMETER | HOLE MOBILITY | 300 | $cm^2/Vs$ |
| | SILICON RELATIVE PERMITTIVITY | 11.2 | |
| | SILICON OXIDE RELATIVE PERMITTIVITY | 3.9 | |
| | VACUUM PERMITTIVITY | 8.85E-14 | F/cm |

FIG.14A    LOW FREQUENCY REGION
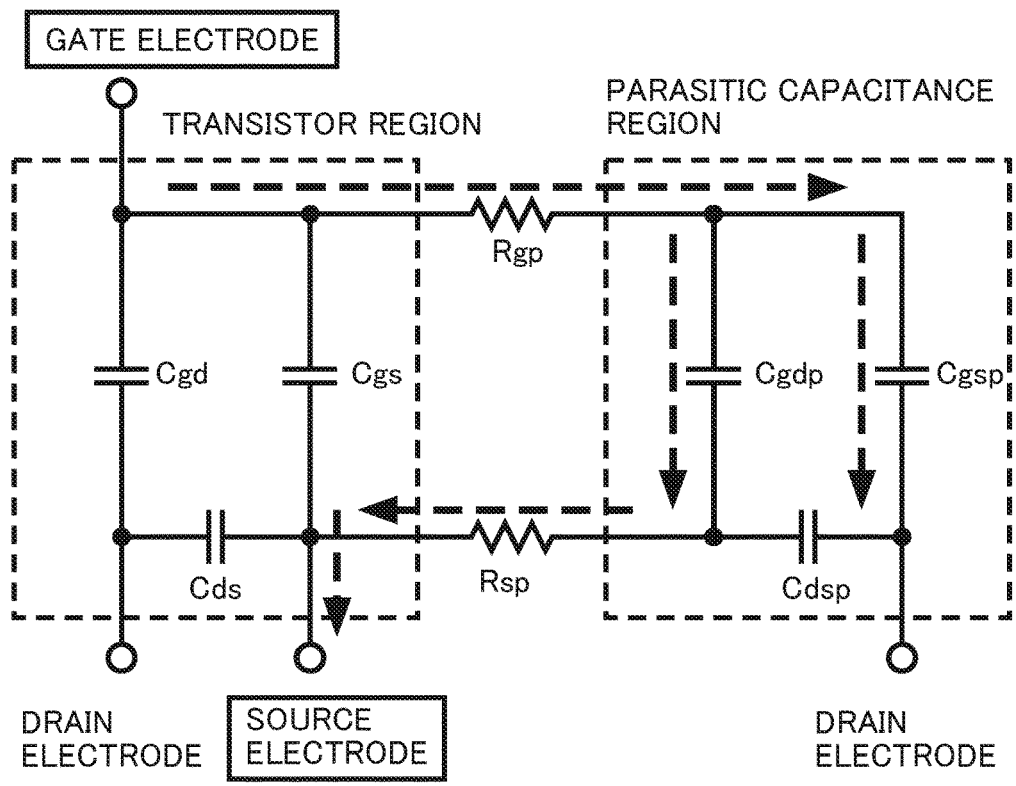
FIG.14B    HIGH FREQUENCY REGION
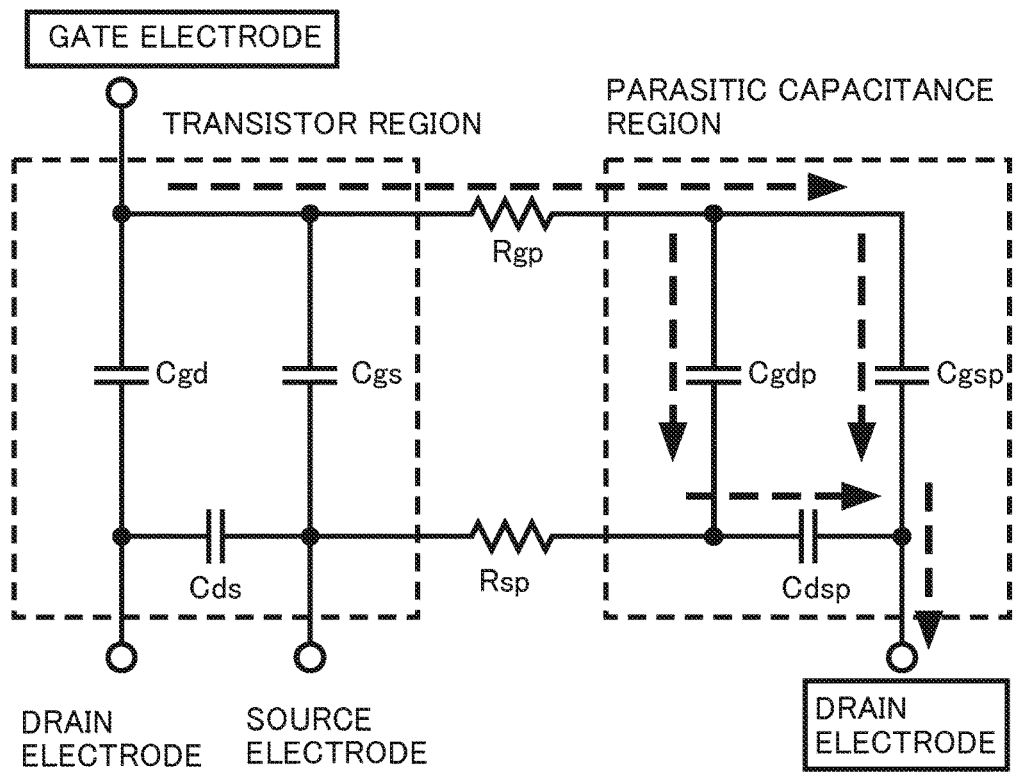

SEMICONDUCTOR DEVICE

CROSS-REFERENCE TO RELATED APPLICATION

This application is based upon and claims the benefit of priority from Japanese Patent Application No. 2017-197705, filed on Oct. 11, 2017, the entire contents of which are incorporated herein by reference.

FIELD

Embodiments described herein relate generally to a semiconductor device.

BACKGROUND

There is a metal oxide semiconductor field effect transistor (MOSFET) having a super junction structure (hereinafter also referred to as "SJ structure") in which an n-type region and a p-type region are alternately arranged in a semiconductor layer. The MOSFET having the SC structure achieves both high breakdown voltage and low on-resistance. In the SJ structure, an n-type impurity amount contained in the n-type region and a p-type impurity amount contained in the p-type region are made equal to create a pseudo non-doped region to realize the high breakdown voltage. At the same time, the impurity concentration of the n-type region can be made high, and thus the low on-resistance can be realized.

However, in the MOSFET having the SJ structure, electromagnetic wave noise at the time of a switching operation may be increased. When the n-type region and the p-type region are rapidly depleted at the time of turning off the MOSFET, a drain-source capacitance (Cds) and a gate-drain capacitance (Cgd) are rapidly decreased. Therefore, a temporal change amount (dv/dt) of a drain voltage and a temporal change amount (di/dt) of a drain current become large. As a result, counter electromotive force due to parasitic inductance and a displacement current due to parasitic capacitance are generated, and a gate-source voltage oscillates. The electromagnetic wave noise at the time of a switching operation is increased due to the oscillation of the gate-source voltage.

If the electromagnetic wave noise at the time of a switching operation is increased, electronic devices and the human body around the MOSFET may be adversely affected. Therefore, suppression of the electromagnetic wave noise at the time of a switching operation of the MOSFET having the SJ structure is required

BRIEF DESCRIPTION OF THE DRAWINGS

FIGS. 10A, 10B, and 10C are explanatory diagrams of functions and effects of the semiconductor device of the first embodiment;

FIG. 11 is an explanatory diagram of functions and effects of the semiconductor device of the first embodiment;

FIGS. 14A and 14B are explanatory diagrams of functions and effects of the semiconductor device of the first embodiment;

DETAILED DESCRIPTION

Figure 1:
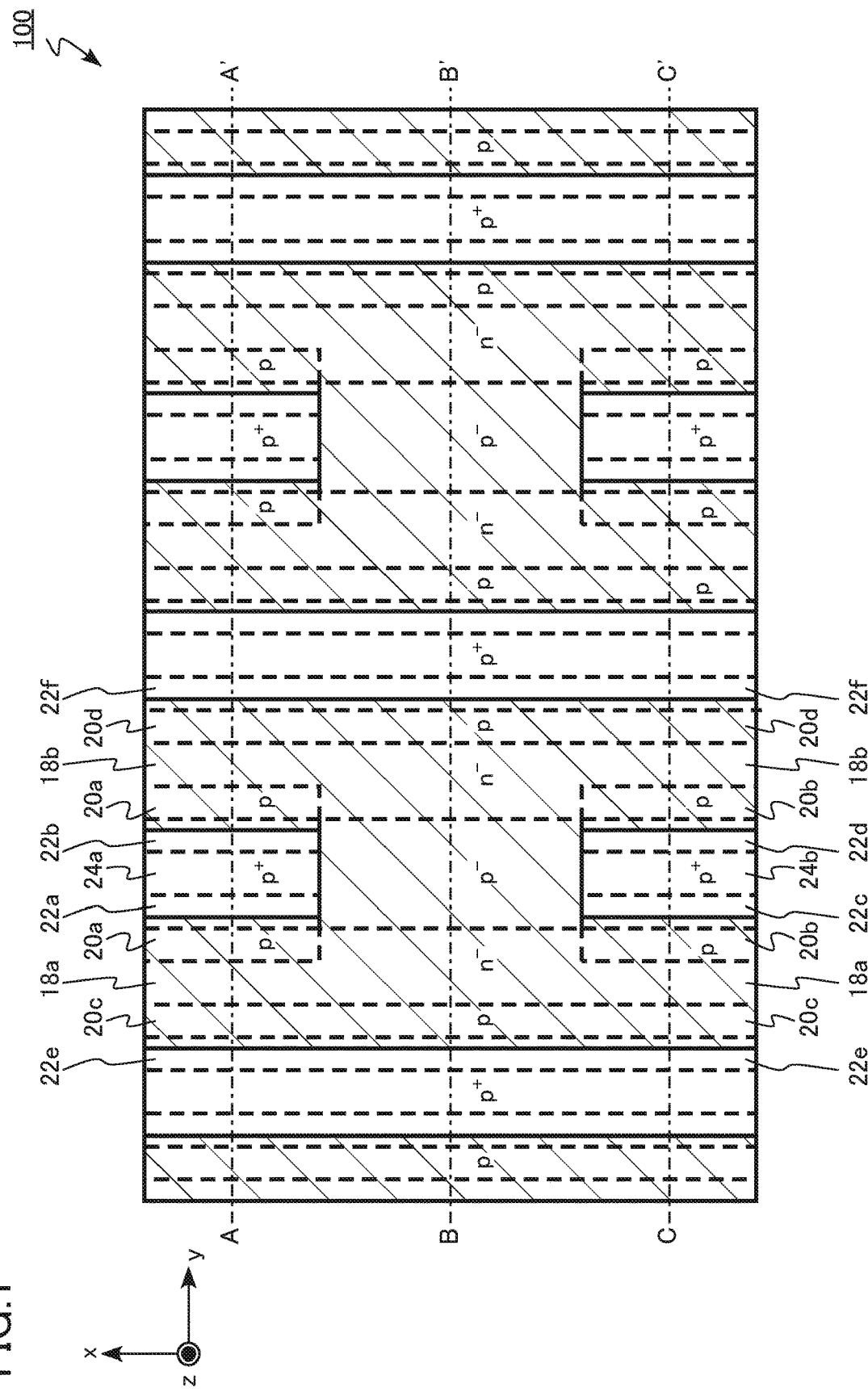
FIG. 1 is a schematic plan view of a semiconductor device of a first embodiment.

Hereinafter, embodiments of the present disclosure will be described with reference to the drawings. Note that, in the following description, the same or similar members and the like are denoted with the same reference numeral, and description of a member or the like, which has been once described, is omitted as appropriate.

Further, in the following description, relative high and low levels of the impurity concentration in each conductivity type may be expressed by the notation of $n^+$, $n$, $n^-$, $p^+$, $p$, and $p^-$. That is, $n^+$ indicates relatively higher n-type impurity concentration than n, and $n^-$ indicates relatively lower n-type impurity concentration than n.

Further, $p^+$ indicates relatively higher p-type impurity concentration than p, and $p^-$ indicates relatively lower p-type impurity concentration than p. Note that $n^+$-type and $n^-$-type may be simply described as n-type, and $p^+$-type and $p^-$-type may be simply described as p-type.

In the present specification, the p-type impurity concentration means a net p-type impurity concentration. The net p-type impurity concentration is a concentration obtained by subtracting an actual n-type impurity concentration from an actual p-type impurity concentration of a semiconductor region. Similarly, in the present specification, the n-type impurity concentration means a net n-type impurity concentration. The net n-type impurity concentration is a concentration obtained by subtracting an actual p-type impurity concentration from an actual n-type impurity concentration of a semiconductor region.

(First Embodiment)

The semiconductor device of the first embodiment includes, a semiconductor layer having a first plane and a second plane; a first semiconductor region of a first conductivity type provided in the semiconductor layer and extending in a first direction; a second semiconductor region of a second conductivity type provided in the semiconductor layer and extending in the first direction; a third semiconductor region of the second conductivity type provided in the semiconductor layer, extending in the first direction, and the first semiconductor region interposed between the third semiconductor region and the second semiconductor region; a first well region of the first conductivity type provided between the first semiconductor region and the first plane, and having higher first conductivity-type impurity concentration than the first semiconductor region; a second well region of the first conductivity type provided between the first semiconductor region and the first plane, having higher first conductivity type impurity concentration than the first semiconductor region, and separated from the first well region in the first direction; a first source region of the second conductivity type provided between the first well region and the first plane; a second source region of the second conductivity type provided between the first well region and the first plane; a first contact region of the first conductivity type provided between the first well region and the first plane and provided between the first source region and the second source region, and having higher first conductivity-type impurity concentration than the first well region; a third source region of the second conductivity type provided between the second well region and the first plane; a fourth source region of the second conductivity type provided between the second well region and the first plane; a second contact region of the first conductivity type provided between the second well region and the first plane and provided between the third source region and the fourth source region, and having higher first conductivity-type impurity concentration than the second well region; a gate electrode having a first gate region, a second gate region, a third gate region, a fourth gate region, and a fifth gate region, and extending in the first direction, the first gate region being provided on the first well region between the second semiconductor region and the first source region, the second gate region being provided on the first well region between the third semiconductor region and the second source region, the third gate region being provided on the second well region between the second semiconductor region and the third source region, the fourth gate region being provided on the second well region between the third semiconductor region and the fourth source region, and the fifth gate region being provided on the first semiconductor region between the first well region and the second well region; a first insulating film provided between the first gate region and the first well region; a second insulating film provided between the second gate region and the first well region; a third insulating film provided between the third gate region and the second well region; a fourth insulating film provided between the fourth gate region and the second well region; a fifth insulating film provided between the fifth gate region and the first semiconductor region; a source electrode having a first region and a second region, the first region being in contact with the first source region, the second source region, and the first contact region, and the second region being in contact with the third source region, the fourth source region, and the second contact region; and a drain electrode in contact with the second plane.

Figure 2:
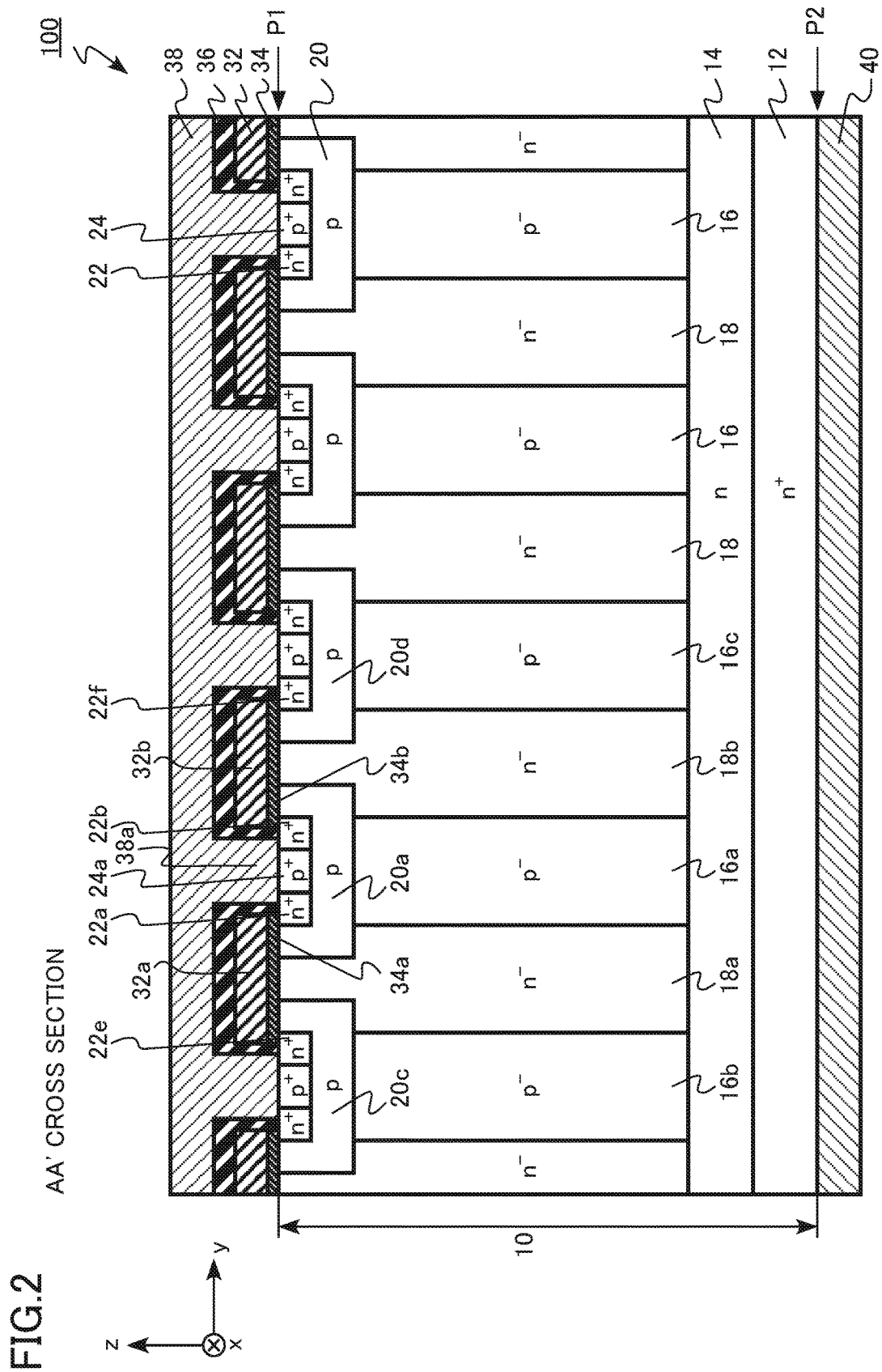
FIG. 2 is a schematic sectional view of the semiconductor device of the first embodiment.
Figure 3:
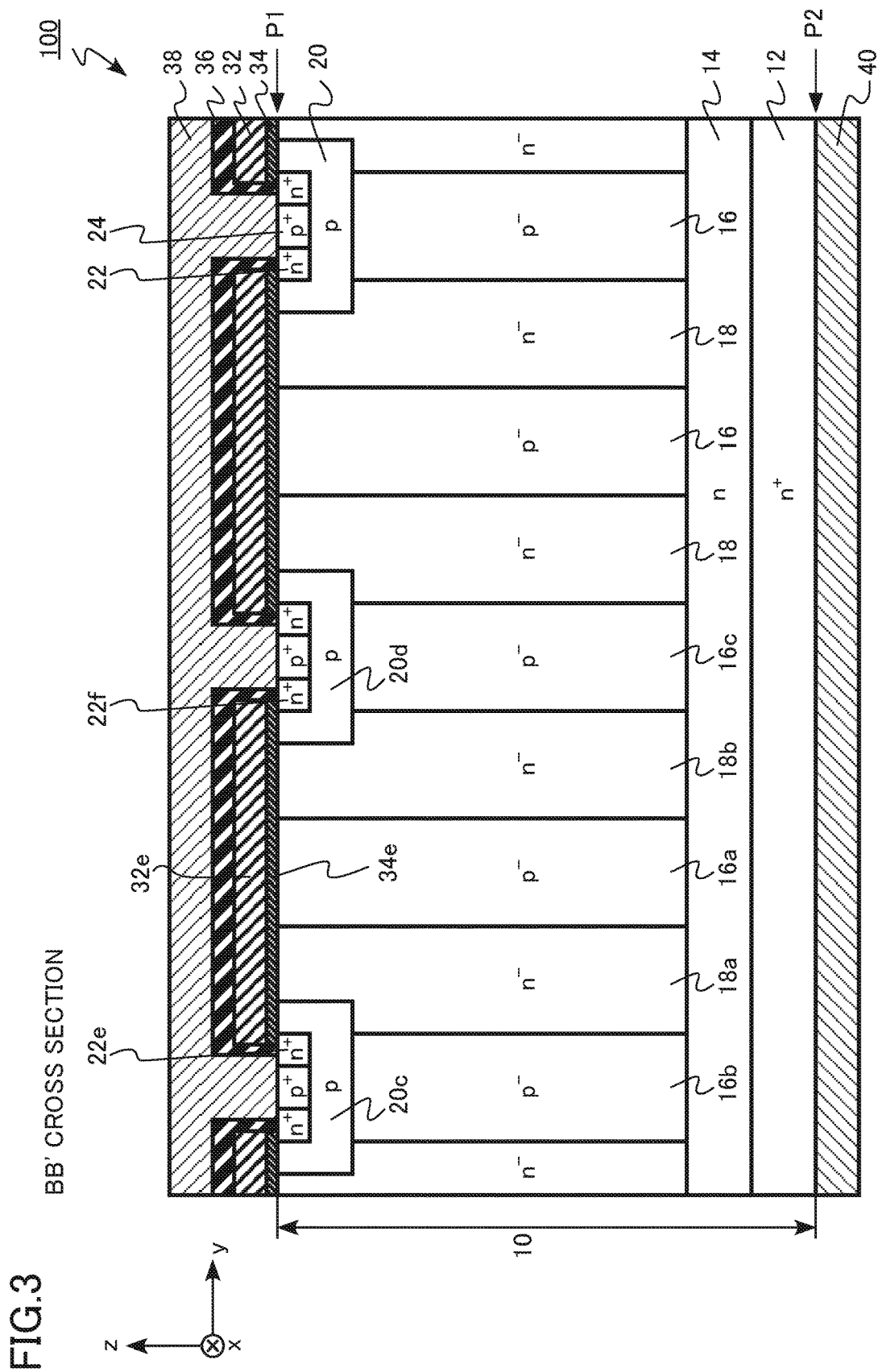
FIG. 3 is a schematic sectional view of the semiconductor device of the first embodiment.
Figure 4:
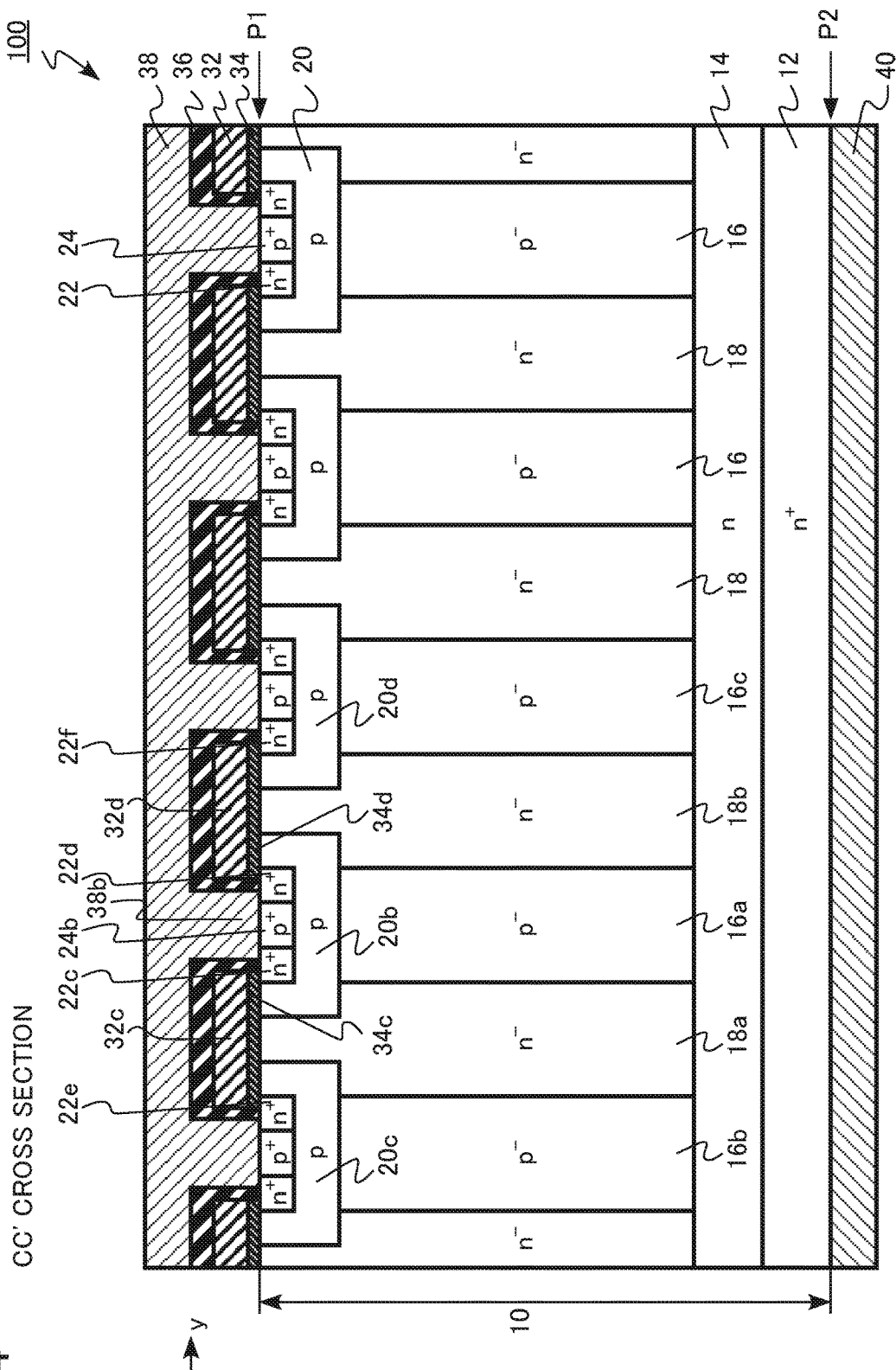
FIG. 4 is a schematic sectional view of the semiconductor device of the first embodiment.

FIG. 1 is a schematic plan view of the semiconductor device of the first embodiment. FIGS. 2, 3 and 4 are schematic sectional views of the semiconductor device of the first embodiment.

FIG. 1 illustrates a pattern of the gate electrode of the semiconductor device and a pattern of the semiconductor regions at a position of an upper plane (a first plane P1 in FIG. 2) of the semiconductor device. The pattern of the gate electrode is hatched. Further, the pattern of the semiconductor regions is indicated by the broken lines.

FIGS. 2, 3, and 4 are sectional views of a plane parallel to a yz plane. FIG. 2 is an A-A' sectional view of FIG. 1. FIG. 3 is a B-B' sectional view of FIG. 1. FIG. 4 is a C-C' sectional view of FIG. 1.

The semiconductor device of the first embodiment is a vertical MOSFET 100 having an SJ structure. The MOSFET 100 is a planar gate-type MOSFET having a MOS structure on a surface of the semiconductor layer.

The MOSFET 100 is an n-type MOSFET using electrons as carriers. In the first embodiment, the first conductivity type is a p type and the second conductivity type is an n type.

The MOSFET 100 includes a semiconductor layer 10, an $n^+$-type drain region 12, an n-type buffer region 14, a $p^-$-type p pillar region 16, an $n^-$-type n pillar region 18, a p-type well region 20, an $n^+$-type source region 22, a $p^+$-type contact region 24, a gate electrode 32, a gate insulating film 34, an interlayer insulating film 36, a source electrode 38, and a drain electrode 40.

A first p pillar region 16a (first semiconductor region), a second p pillar region 16b (fourth semiconductor region), and a third p pillar region 16c (fifth semiconductor region) are ones in the p pillar region 16. A first n pillar region 18a (second semiconductor region) and a second n pillar region 18b (third semiconductor region) are ones in the n pillar region 18.

A first well region 20a, a second well region 20b, a third well region 20c, and a fourth well region 20d are ones in the well region 20. A first source region 22a, a second source region 22b, a third source region 22c, a fourth source region 22d, a fifth source region 22e, and a sixth source region 22f are ones in the source region 22. A first contact region 24a and a second contact region 24b are ones in the contact region 24.

A first gate region 32a, a second gate region 32b, a third gate region 32c, a fourth gate region 32d, and a fifth gate region 32e are ones of the gate electrode 32. A first insulating film 34a, a second insulating film 34b, a third insulating film 34c, a fourth insulating film 34d, and a fifth insulating film 34e are ones in the gate insulating film 34 or parts of the gate insulating film 34.

The semiconductor layer 10 has a first plane (P1 in FIG. 1) and a second plane (P2 in FIG. 1) facing the first plane P1. In FIG. 1, the first plane P1 is an upper plane in the figure and the second plane P2 is a lower plane in the figure.

The semiconductor layer 10 is made of, for example, single crystal silicon.

The n+-type drain region 12 is provided in the semiconductor layer 10. The drain region 12 is provided in contact with the second plane P2 of the semiconductor layer 10.

The drain region 12 contains n-type impurities. The n-type impurities are, for example, phosphorus (P).

The n-type impurity concentration is, for example, from $1\times10^{18}$ cm$^{-3}$ to $1\times10^{21}$ cm$^{-3}$, both inclusive.

The drain region 12 is electrically connected to the drain electrode 40. The drain region 12 has a function to reduce a contact resistance between the semiconductor layer 10 and the drain electrode 40.

The n-type buffer region 14 is provided in the semiconductor layer 10. The buffer region 14 is provided on the drain region 12.

The buffer region 14 contains n-type impurities. The n-type impurities are, for example, phosphorus (P).

The n-type impurity concentration of the buffer region 14 is lower than the n-type impurity concentration of the drain region 12. The n-type impurity concentration is, for example, from $1\times10^{15}$ cm$^{-3}$ to $1\times10^{17}$ cm$^{-3}$, both inclusive.

The buffer region 14 has a function to suppress a depletion layer extending at the time of an off operation of the MOSFET 100.

A plurality of p−-type p pillar regions 16 is provided between the drain region 12 and the first plane P1. The p pillar region 16 is provided on the buffer region 14.

The p pillar region 16 extends in an x direction (a first direction). The p pillar region 16 has a flat plate shape parallel to an xz plane. A distance (the depth of the p pillar region 16) from an end portion of the p pillar region 16 on a side of the first plane P1 to an end portion of the p pillar region 16 on a side of the second plane P2 is, for example, 20 µm or more.

The p pillar region 16 contains p-type impurities. The p-type impurities are, for example, boron (B). The p-type impurity concentration is, for example, from $1\times10^{15}$ cm$^{-3}$ to $8\times10^{16}$ cm$^{-3}$, both inclusive. The p-type impurity concentration of the p pillar region 16 in a depth direction is approximately constant.

A plurality of n−-type n pillar regions 18 is provided between the drain region 12 and the first plane P1. The n pillar region 18 is provided on the buffer region 14. The n pillar region 18 is provided between the p pillar regions 16.

The n pillar region 18 extends in the x direction The n pillar region 18 has a flat plate shape parallel to the xz plane.

The n pillar region 18 contains n-type impurities. The n-type impurities are, for example, phosphorus (P).

The n-type impurity concentration of the n pillar region 18 is, for example, from $1\times10^{15}$ cm$^{-3}$ to $8\times10^{16}$ cm$^{-3}$, both inclusive. The n-type impurity concentration of the n pillar region 18 is approximately constant in the depth direction.

The n pillar region 18 functions as a current path at the time of an on operation of the MOSFET 100.

The p pillar region 16 and the n pillar region 18 are alternately disposed in a y direction (second direction). The p pillar region 16 and the n pillar region 18 form the SJ structure. Improvement of breakdown voltage of the MOSFET 100 and reduction of on-resistance are realized by the SJ structure. A disposition pitch of the p pillar region 16 and the n pillar region 18 in the y direction is, for example, from 4 µm to 20 µm, both inclusive.

The first p pillar region 16a (first semiconductor region) is sandwiched between the first n pillar region 18a (second semiconductor region) and the second n pillar region 18b (third semiconductor region). The first n pillar region 18a (second semiconductor region) is sandwiched between the first p pillar region 16a (first semiconductor region) and the second p pillar region 16b (fourth semiconductor region). The second n pillar region 18b (third semiconductor region) is sandwiched between the first p pillar region 16a (first semiconductor region) and the third p pillar region 16c (fifth semiconductor region).

The first p pillar region 16a (first semiconductor region) and the first n pillar region 18a (second semiconductor region), the first p pillar region 16a (first semiconductor region) and the second n pillar region 18b (third semiconductor region), the first n pillar region 18a (second semiconductor region) and the second p pillar region 16b (fourth semiconductor region), the second n pillar region 18b (third semiconductor region) and the third p pillar region 16c (fifth semiconductor region) are in contact with each other.

The p-type well region 20 is provided between the p pillar region 16 and the first plane P1. At least a part of the well region 20 is in contact with the first plane. The well region 20 extends in the x direction.

The well region 20 contains p-type impurities. The p-type impurities are, for example, boron (B). The p-type impurity concentration of the well region 20 is higher than the p-type impurity concentration of the p pillar region 16. The p-type impurity concentration is, for example, from $5\times10^{16}$ cm$^{-3}$ to $5\times10^{18}$ cm$^{-3}$, both inclusive.

An inversion layer is formed in a region of the well region 20, the region being right under the gate electrode 32, at the time of an on operation of the MOSFET 100. The inversion layer functions as a channel of the MOSFET 100.

The first well region 20a is provided between the p pillar region 16a (first semiconductor region) and the first plane P1. The second well region 20b is provided between the p pillar region 16a (first semiconductor region) and the first plane P1.

The first well region 20a and the second well region 20b are separated in the x direction (first direction). In other words, the well region 20 does not exist between the first well region 20a and the second well region 20b, and the p pillar region 16a is in contact with the first plane P1.

The third well region 20c is provided between the p pillar region 16b (fourth semiconductor region) and the first plane P1. The fourth well region 20d is provided between the p pillar region 16c (fifth semiconductor region) and the first plane P1. The third well region 20c and the fourth well region 20d extend in the x direction (first direction).

The MOSFET 100 has a structure in which the well region 20 on the p pillar region 16 arranged in the y direction (second direction) is thinned out every other p pillar region 16b.

The n+-type source region 22 is provided between the well region 20 and the first plane P1. The source region 22 extends in the x direction (first direction). The source region 22 contains n-type impurities. The n-type impurities are, for example, phosphorus (P). The n-type impurity concentration is, for example, from $1\times10^{18}$ cm$^{-3}$ to $1\times10^{22}$ cm$^{-3}$, both inclusive.

The source region 22 is electrically connected to the source electrode 38.

The first source region 22a is provided between the first well region 20a and the first plane P1. The second source region 22b is provided between the first well region 20a and the first plane P1. The third source region 22c is provided between the second well region 20b and the first plane P1. The fourth source region 22d is provided between the second well region 20b and the first plane P1.

The fifth source region 22e is provided between the third well region 20c and the first plane P1. The sixth source region 22f is provided between the fourth well region 20d and the first plane P1.

The first source region 22a, the second source region 22b, the third source region 22c, the fourth source region 22d, the fifth source region 22e, and the sixth source region 22f extend in the x direction.

The p$^+$-type contact region 24 is provided between the well region 20 and the first plane P1. The contact region 24 is provided adjacent to the source region 22. The contact region 24 extends in the x direction.

The contact region 24 contains p-type impurities. The p-type impurities are, for example, boron (B). The p-type impurity concentration is, for example, from $1\times10^{18}$ cm$^{-3}$ to $1\times10^{22}$ cm$^{-3}$, both inclusive.

The contact region 24 is electrically connected to the source electrode 38. The contact region 24 has a function to reduce a contact resistance between the semiconductor layer 10 and the source electrode 38.

The first contact region 24a is provided between the first source region 22a and the second source region 22b. The first contact region 24a is provided between the first well region 20a and the first plane P1.

The second contact region 24b is provided between the third source region 22c and the fourth source region 22d. The second contact region 24b is provided between the second well region 20b and the first plane P1.

The gate electrode 32 is provided on the first plane P1 of the semiconductor layer 10. The gate electrode 32 is a conductive layer. The gate electrode 32 extends in the x direction (first direction). The gate electrode 32 is made of, for example, polycrystalline silicon containing n-type impurities or p-type impurities.

The gate electrode 32 has the first gate region 32a, the second gate region 32b, the third gate region 32c, the fourth gate region 32d, and the fifth gate region 32e. The first gate region 32a is provided on the first well region 20a between the first n pillar region 18a (second semiconductor region) and the first source region 22a. The second gate region 32b is provided on the first well region 20a between the second n pillar region 18b (third semiconductor region) and the second source region 22b. The third gate region 32c is provided on the second well region 20b between the first n pillar region 18a (second semiconductor region) and the third source region 22c. The fourth gate region 32d is provided on the second well region 20b between the second n pillar region 18b (third semiconductor region) and the fourth source region 22d.

The fifth gate region 32e is provided on the first p pillar region 16a (first semiconductor region) between the first well region 20a and the second well region 20b. The fifth gate region 32e is provided between the first gate region 32a and the third gate region 32c. The fifth gate region 32e is provided between the second gate region 32b and the fourth gate region 32d.

The gate insulating film 34 is provided between the gate electrode 32 and the semiconductor layer 10. The gate insulating film 34 is provided between the gate electrode 32 and a portion where the well region 20 is in contact with the first plane P1. The gate insulating film 34 is in contact with the first plane P1. The gate insulating film 34 is made of, for example, silicon oxide.

The first insulating film 34a is provided between the first gate region 32a and the first well region 20a. The second insulating film 34b is provided between the second gate region 32b and the first well region 20a. The third insulating film 34c is provided between the third gate region 32c and the second well region 20b. The fourth insulating film 34d is provided between the fourth gate region 32d and the second well region 20b.

The fifth insulating film 34e is provided between the fifth gate region 32e and the first p pillar region 16a (first semiconductor region). The fifth insulating film 34e is provided between the fifth gate region 32e and the third well region 20c. The fifth insulating film 34e is provided between the fifth gate region 32e and the fourth well region 20d. The fifth insulating film 34e is in contact with the first plane P1 and the first p pillar region 16a.

The MOSFET 100 has a structure in which the well region 20 and the contact region 24 on a plurality of the p pillar regions 16 arranged in the y direction (second direction) are thinned out every other p pillar region 16. Then, the gate electrode 32 is provided on the p region 16 from which the well region 20 and the contact region 24 are thinned out.

The interlayer insulating film 36 is provided on the gate electrode 32. The interlayer insulating film 36 is made of, for example, silicon oxide.

The source electrode 38 is in contact with the first plane P1 of the semiconductor layer 10. The source electrode 38 is in contact with the first plane P1 in an opening portion provided in the interlayer insulating film 36. The source electrode 38 is in contact with the source region 22 and the contact region 24. A contact between the source electrode 38, and the source region 22 and the contact region 24 is an ohmic contact.

The source electrode 38 has a first region 38a and a second region 38b. The first region 38a is in contact with the first source region 22a, the second source region 22b, and the first contact region 24a. The second region 38b is in contact with the third source region 22c, the fourth source region 22d, and the second contact region 24b.

The source electrode 38 is made of a metal. The source electrode 38 contains, for example, aluminum (Al).

The drain electrode 40 is in contact with the second plane P2 of the semiconductor layer 10. The drain electrode 40 is in contact with the drain region 12. A contact between the drain electrode 40 and the drain region 12 is an ohmic contact.

The drain electrode 40 is made of a metal. The drain electrode 40 includes, for example, aluminum (Al).

The impurity concentration and distribution of the impurity concentration in the semiconductor regions can be obtained using secondary ion mass spectroscopy (SIMS), for example.

The distribution of the impurity concentration and the magnitude relationship of the impurity concentration in the semiconductor regions can also be obtained using scanning capacitance microscopy (SCM), for example.

When comparing the magnitude of the impurity concentration between the semiconductor regions, for example, the impurity concentration in the vicinity of a center of each semiconductor region is regarded as the impurity concentration of the semiconductor region and compared.

Dimensions such as depths and widths of the semiconductor regions can be obtained by SIMS, for example. Further, the dimensions such depths and widths of the semiconductor regions can be obtained from a combined image of an SCM image and an atomic force microscope (AFM) image, for example.

Note that the SJ structure of the first embodiment can be formed by, for example, a so-called single epitaxial method in which a p-type semiconductor is buried in a trench formed in an n-type semiconductor region of the semiconductor layer 10, the trench being formed for formation of a p pillar region. Further, the SJ structure can also be formed by, for example, a so-called multi-epitaxial method in which formation of an n-type epitaxial layer and ion implantation of a p-type impurity are repeatedly performed a plurality of times.

Next, functions and effects of the semiconductor device of the first embodiment will be described.

MOSFETs used in a power supply circuit such as a switching power supply is required to decrease the on-resistance and improve switching speed in response to the demand for downsizing of the power supply circuit. Improvement of the switching speed of the MOSFET enables reduction of the size of a passive device such as an inductance and a capacitance in the power supply circuit and realization of downsizing of the power supply circuit.

However, if the switching speed of the MOSFET Is increased, electromagnetic wave noise at the time of the switching operation may be increased. In particular, in the MOSFET having the SJ structure, the drain-source capacitance (Cds) and the gate-drain capacitance (Cgd) are rapidly decreased as the n-type region and the p-type region are rapidly depleted at the time of turning off the MOSFET. Therefore, a temporal change amount (dv/dt) of a drain voltage and a temporal change amount (di/dt) of a drain current become large. As a result, counter electromotive force due to parasitic inductance and a displacement current due to parasitic capacitance are generated, and a gate-source voltage oscillates. The electromagnetic wave noise at the time of a switching operation is increased due to the oscillation of the gate-source voltage.

If the electromagnetic wave noise at the time of a switching operation is increased, electronic devices and the human body around the MOSFET may be adversely affected. Therefore, suppression of the electromagnetic wave noise at the time of a switching operation of the MOSFET having the SJ structure is required.

Figure 5:
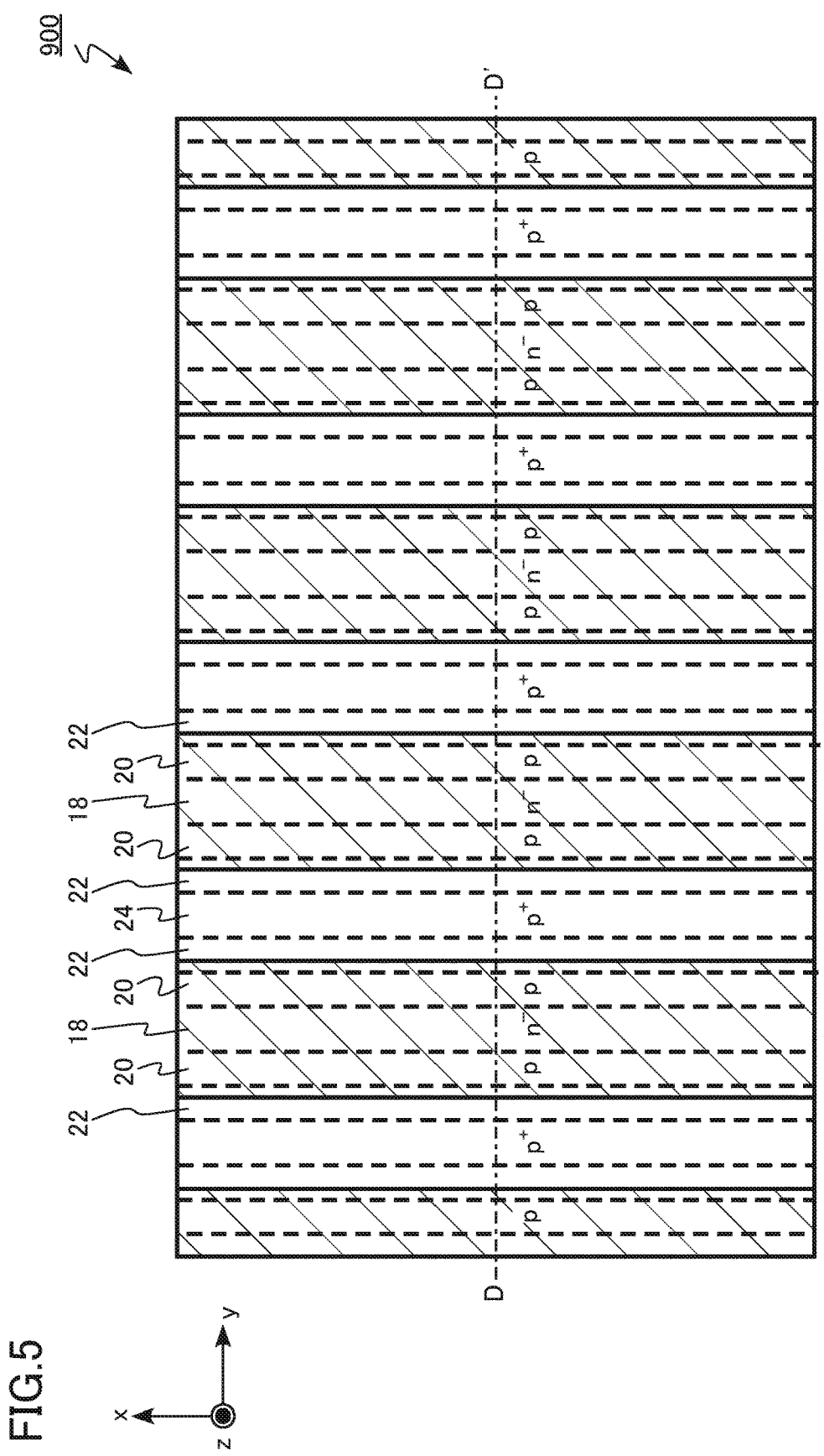
FIG. 5 is a schematic plan view of a semiconductor device of a comparative example.
Figure 6:
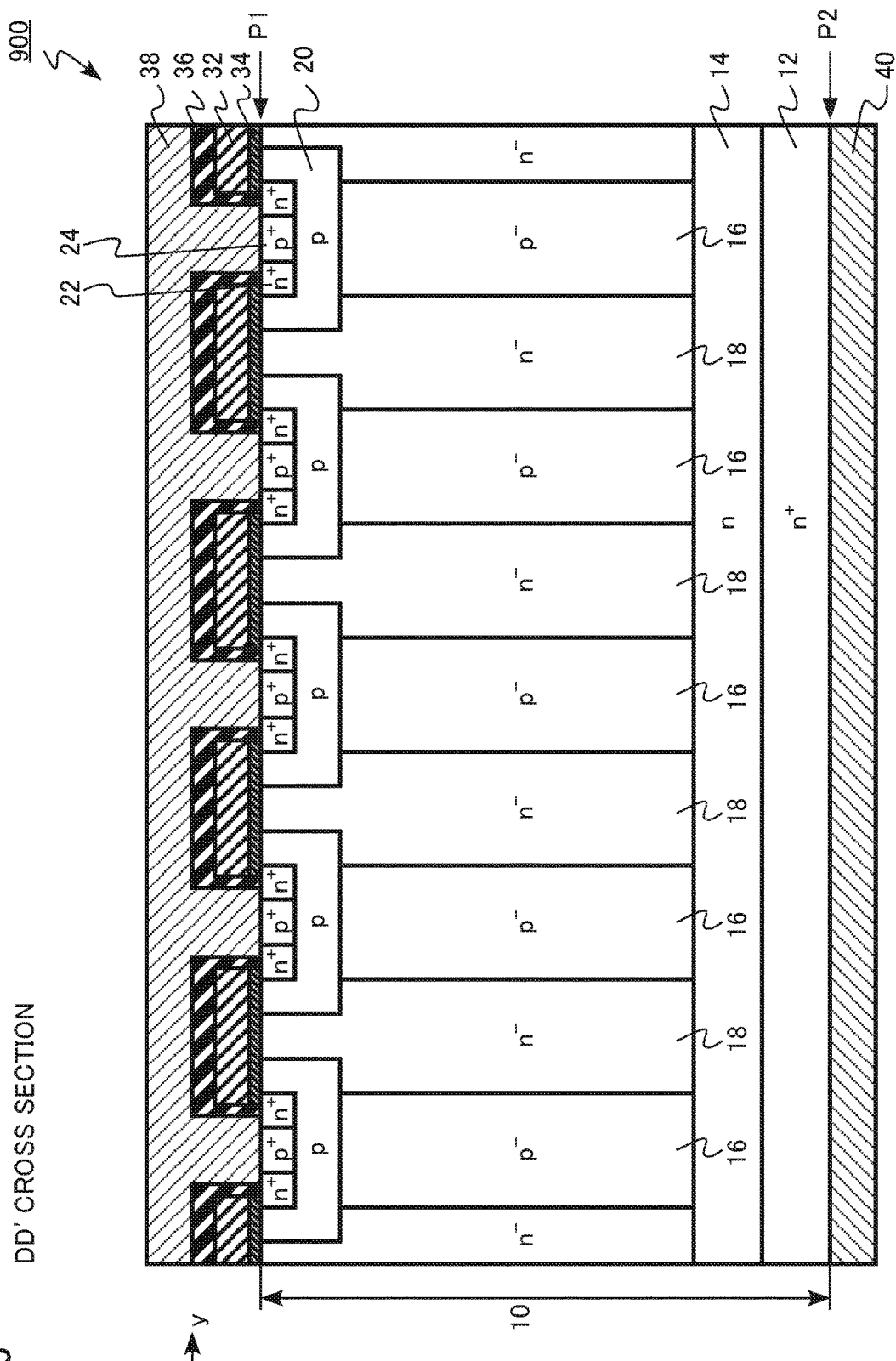
FIG. 6 is a schematic sectional view of the semiconductor device of the comparative example.

FIG. 5 is a schematic plan view of a semiconductor device of a comparative example. FIG. 6 is a schematic sectional view of the semiconductor device of the comparative example.

FIG. 5 illustrates a pattern of a gate electrode of the semiconductor device and a pattern of semiconductor regions at a position of an upper plane (a first plane P1 in FIG. 6) of the semiconductor device. The pattern of the gate electrode is hatched. Further, the pattern of the semiconductor regions is indicated by the broken lines.

FIG. 6 is a sectional view of a plane parallel to the yz plane. FIG. 6 is a D-D' sectional view of FIG. 5.

The semiconductor device of the comparative example is a vertical MOSFET having an SJ structure. A MOSFET 900 of the comparative example is different from the MOSFET 100 of the first embodiment in that a first well region 20a and a second well region 20b separated in an x direction are not included, and all well regions 20 are continuous in the direction. Further, the MOSFET 900 of the comparative example is different from the MOSFET 100 of the first embodiment in that a gate electrode 32 does not have a fifth gate region 32e provided on a first p pillar region 16a (first semiconductor region), and all gate electrodes 32 are formed on a well region 20.

As is clear from the comparison with the MOSFET 900 of the comparative example, the MOSFET 100 of the first embodiment is not provided with the well region 20 and the contact region 24 on the first p pillar region 16a (first semiconductor region) in a part of the region, and thus the contact of the source electrode 38 to the first p pillar region 16a (first semiconductor region) is thinned out. In the region where the contact of the source electrode 38 is thinned out, the source region 22 is also thinned out and thus the region does not function as a transistor. Hereinafter, the region where the contact of the source electrode 38 is thinned out is referred to as parasitic capacitance region.

Figure 7A:
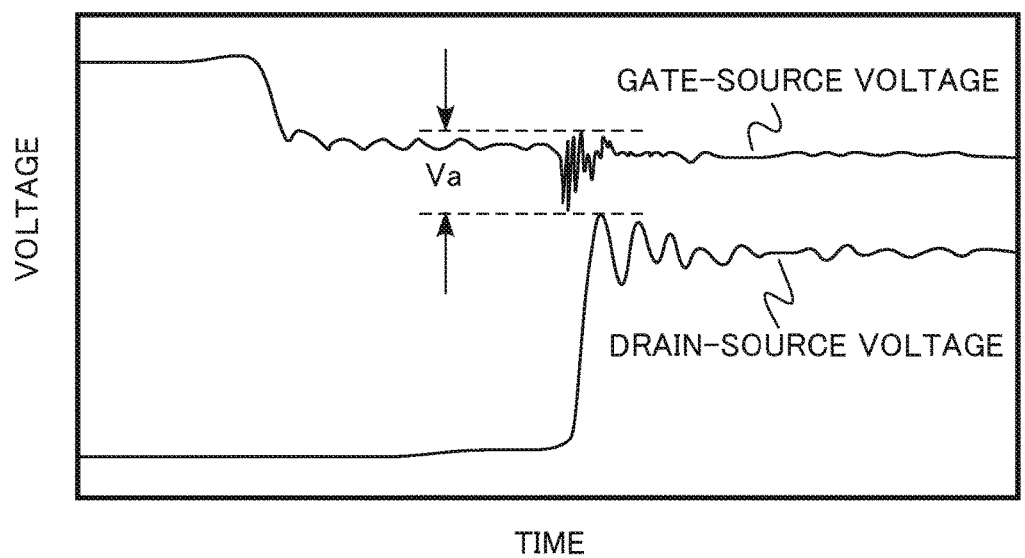
FIGS. 7A and 7B are explanatory diagrams of functions and effects of the semiconductor device of the first embodiment.
Figure 7B:
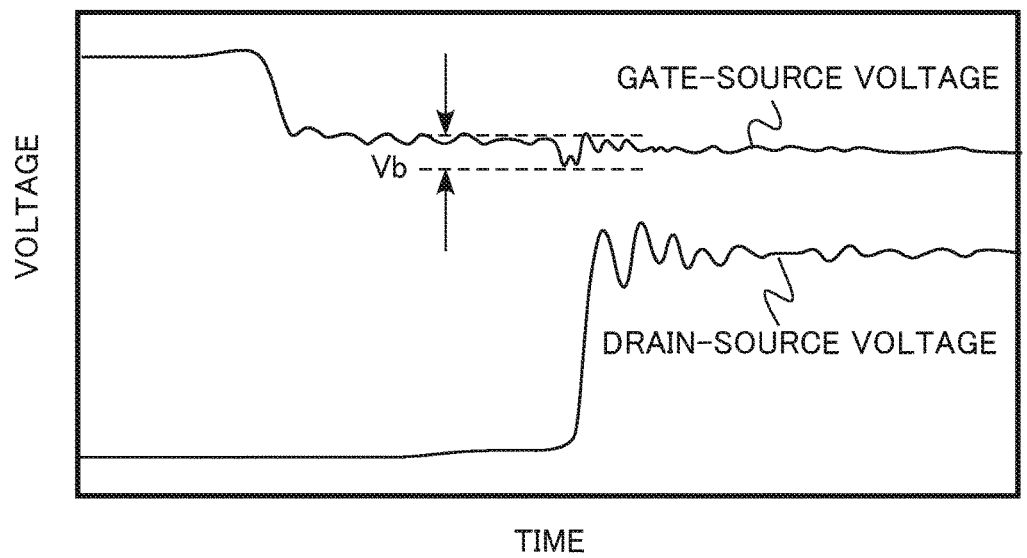

FIGS. 7A and 7B are explanatory diagrams of functions and effects of the semiconductor device of the first embodiment. FIGS. 7A and 7B are diagrams illustrating simulation results of temporal change of a gate-source voltage at the time of the switching operation of the MOSFET and temporal change of a drain-source voltage. FIGS. 7A and 7B illustrate simulation results at the time of a turn-off operation of the MOSFET. FIG. 7A illustrates a case of a similar structure to the comparative example having no parasitic capacitance region, and FIG. 7B illustrates a case of a similar structure to the first embodiment having the parasitic capacitance region.

As is clear from FIGS. 7A and 7B, maximum amplitude Vb of oscillation of the gate-source voltage in the case of having the parasitic capacitance region is smaller than maximum amplitude Va of oscillation of the gate-source voltage in the case of not having the parasitic capacitance region. The maximum amplitude Vb is 50% or less of the maximum amplitude Va. According to the MOSFET 100 of the first embodiment, the oscillation of the gate-source voltage is suppressed, and the electromagnetic wave noise at the time of the switching operation is suppressed.

Figure 8:
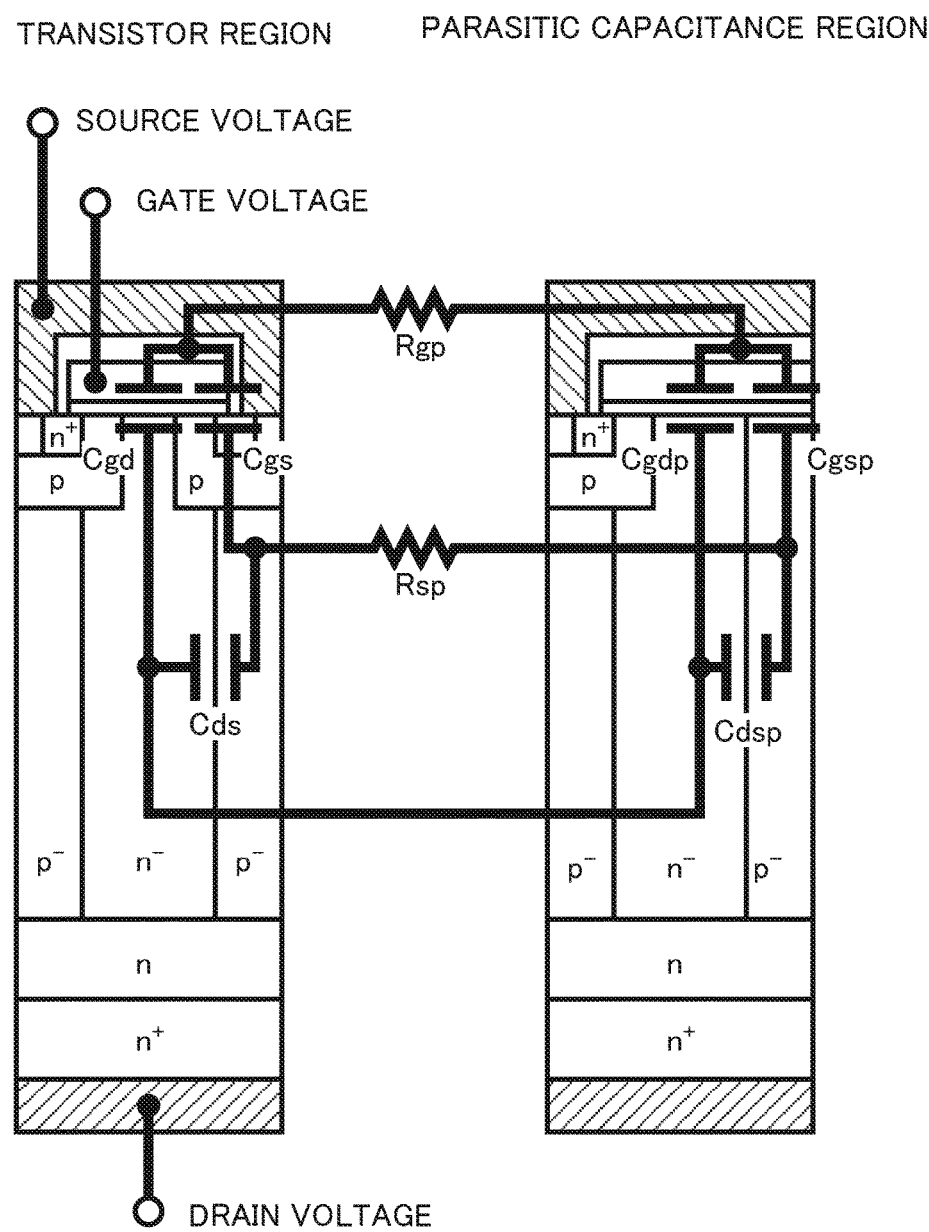
FIG. 8 is an explanatory diagram of functions and effects of the semiconductor device of the first embodiment.

FIG. 8 is an explanatory diagram of functions and effects of the semiconductor device of the first embodiment. FIG. 8 is an explanatory diagram of an equivalent circuit of the MOSFET 100 of the first embodiment.

The transistor region in FIG. 8 corresponds to the regions illustrated in FIGS. 2 and 4. The parasitic capacitance region in FIG. 8 corresponds to the region illustrated in FIG. 3.

The transistor region has a gate-source capacitance (Cgs), a gate-drain capacitance (Cgd), and a drain-source capacitance (Cds). Further, the parasitic capacitance region includes a gate-source capacitance (Cgsp), a gate-drain capacitance (Cgdp), and a drain-source capacitance (Cdsp).

In the parasitic capacitance region, the gate electrode is also provided on the p pillar region, and thus the gate-source capacitance (Cgsp) becomes large.

The transistor region and the parasitic capacitance region are connected via a gate resistor (Rgp) and a p pillar resistor (Rsp). The gate resistance (Rgp) is an electric resistance of the gate electrode 32. The p pillar resistance (Rsp) is a p pillar resistance of the region where the well region 20 and the contact region 24 are thinned out.

Figure 9A:
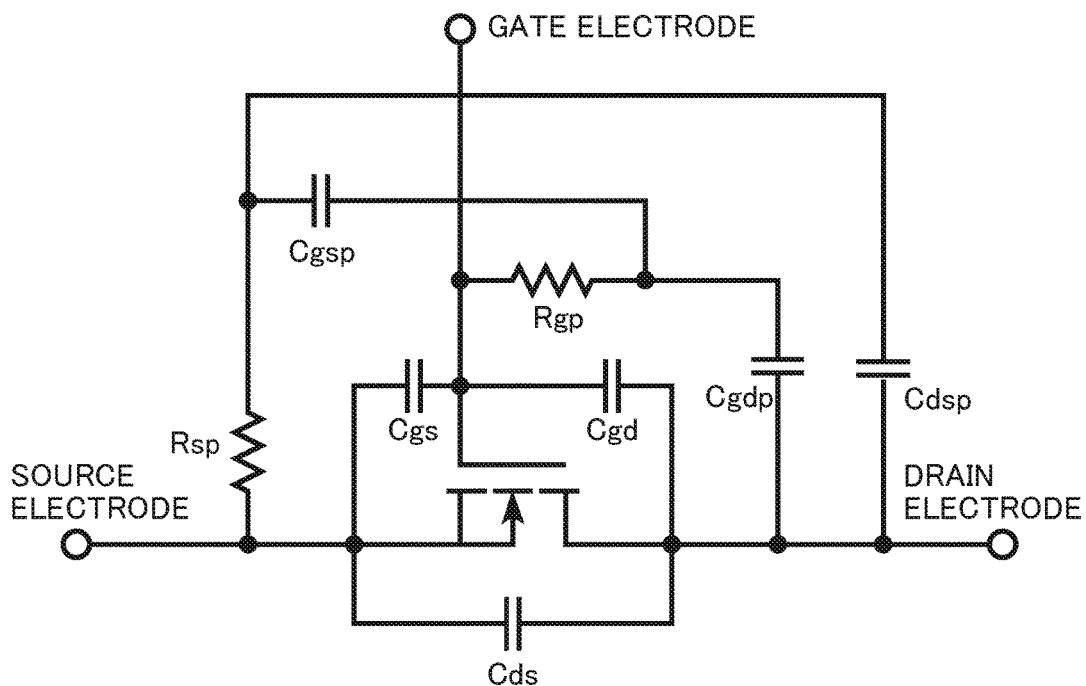
FIGS. 9A and 9B are explanatory diagrams of functions and effects of the semiconductor device of the first embodiment.
Figure 9B:
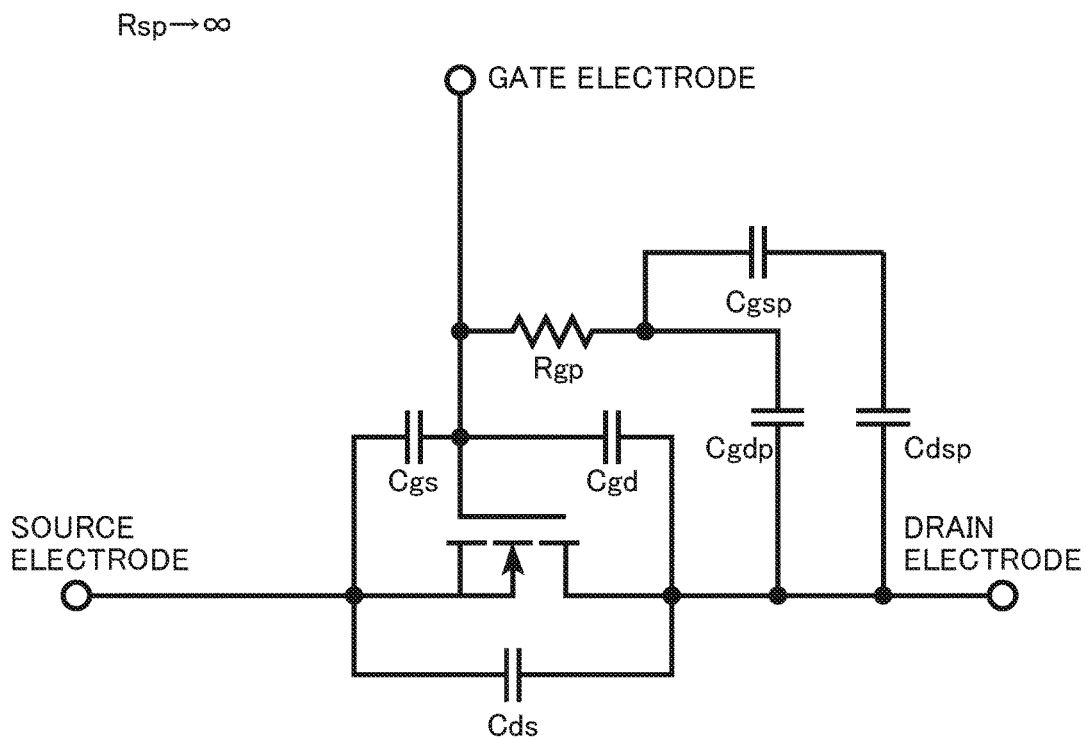

FIGS. 9A and 9B are explanatory diagrams of functions and effects of the semiconductor device of the first embodiment. FIG. 9 is an equivalent circuit diagram of the MOSFET 100 of the first embodiment.

FIG. 9A is a circuit diagram of the equivalent circuit illustrated in FIG. 8, FIG. 9B is a diagram of a case where the p pillar resistance (Rsp) becomes infinite in the circuit of FIG. 9A.

Generally, the oscillation of the gate-source voltage at the time of the switching operation of the MOSFET is suppressed by increasing the gate-drain capacitance (Cgd). By increasing the gate-drain capacitance (Cgd), the temporal change amount (dv/dt) of the drain voltage and the temporal change amount (di/dt) of the drain current are suppressed and the oscillation of the gate-source voltage is suppressed.

As illustrated in FIG. 9B, in the MOSFET 100 of the first embodiment, the gate-source capacitance (Cgsp) of the parasitic capacitance region is transferred to the gate-drain capacitance by increasing the p pillar resistance (Rsp). Therefore, the effective gate-drain capacitance at the time of the switching operation of the MOSFET 100 is increased. Therefore, the oscillation of the gate-source voltage is suppressed, and the electromagnetic wave noise is suppressed.

As described above, the oscillation of the gate-source voltage at the time of the switching operation of the MOSFET is suppressed by increasing the gate-drain capacitance (Cgd). However, a charge/discharge time of the gate-drain capacitance (Cgd) is increased and a switching operation speed of the MOSFET is decreased as the gate-drain capacitance (Cgd) is increased. Therefore, in general, there is a trade-off relationship between suppression of electromagnetic wave noise and a high-speed switching operation.

In the first embodiment, the effective gate-drain capacitance at the time of the switching operation of the MOSFET 100 has frequency dependency. Therefore, the electromagnetic wave noise can be suppressed while the decrease in the switching operation speed is suppressed. Details will be described below.

FIGS. 10A, 10B, 10C, 11, 12A, 12B, 13, 14A, 14B, 15A and 15B are explanatory diagrams of functions and effects of the first embodiment.

FIGS. 10A, 10B, 10C, and 11 are explanatory diagrams of simulation parameters when simulating the MOSFET 100.

FIG. 10A is a schematic plan view illustrating a pattern of the semiconductor regions of the MOSFET 100. FIGS. 10B and 10C are schematic sectional views of the MOSFET 100. FIG. 10B is a sectional view of an AA' cross section of FIG. 10A, and FIG. 10C is a BB' cross section of FIG. 10A. FIG. 10B is a cross section of the transistor region, and FIG. 10C is a cross section of the parasitic capacitance region. Note that the CC' cross section of FIG. 10A is similar to that of FIG. 10B, and thus illustration is omitted.

FIG. 10A illustrates length parameters of the transistor region and the parasitic capacitance region of the MOSFET 100. FIG. 10B illustrates structural parameters of the transistor region. FIG. 10C illustrates structural parameters of the parasitic capacitance region.

FIG. 11 is a table illustrating specific numerical values used in the simulation. The table illustrates the structural parameters of the transistor region illustrated in FIG. 10B, the structural parameters of the parasitic capacitance region illustrated in FIG. 10C, and physical parameters.

Figure 12A:
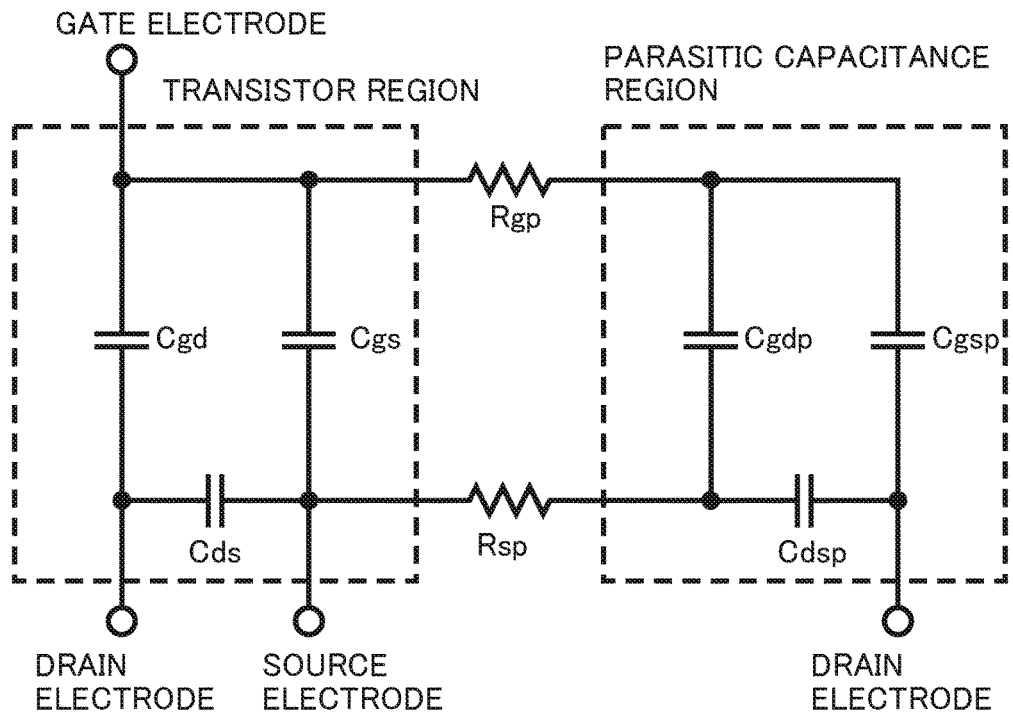
FIGS. 12A and 12B are explanatory diagrams of functions and effects of the semiconductor device of the first embodiment.
Figure 12B:
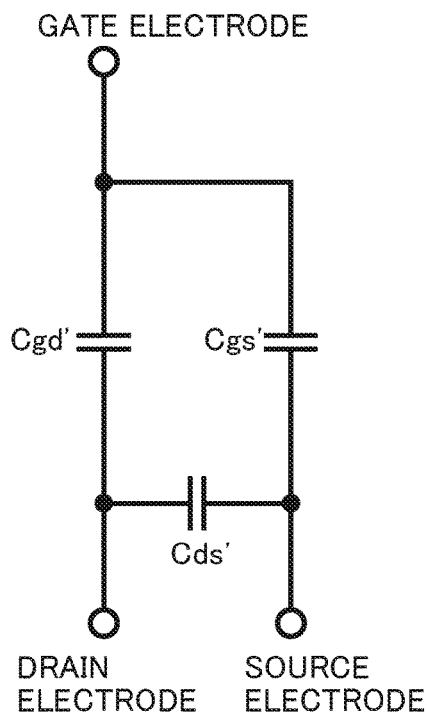

FIGS. 12A and 12B illustrate equivalent circuit diagrams used for simulation. FIG. 12A is an equivalent circuit diagram, and FIG. 12B is an explanatory diagram of capacity required in the simulation. The parameters illustrated in the table of FIG. 11 were applied to the equivalent circuit of FIG. 12A, and the frequency dependency of the effective gate-drain capacitance (Cgd') of the MOSFET 100 illustrated in FIG. 12B was calculated.

Note that the structural length (L in FIG. 10A) of the transistor region and the parasitic capacitance region was 200 μm. In addition, the parasitic capacitance region ratio (Lb/L) was set to 80%.

Figure 13:
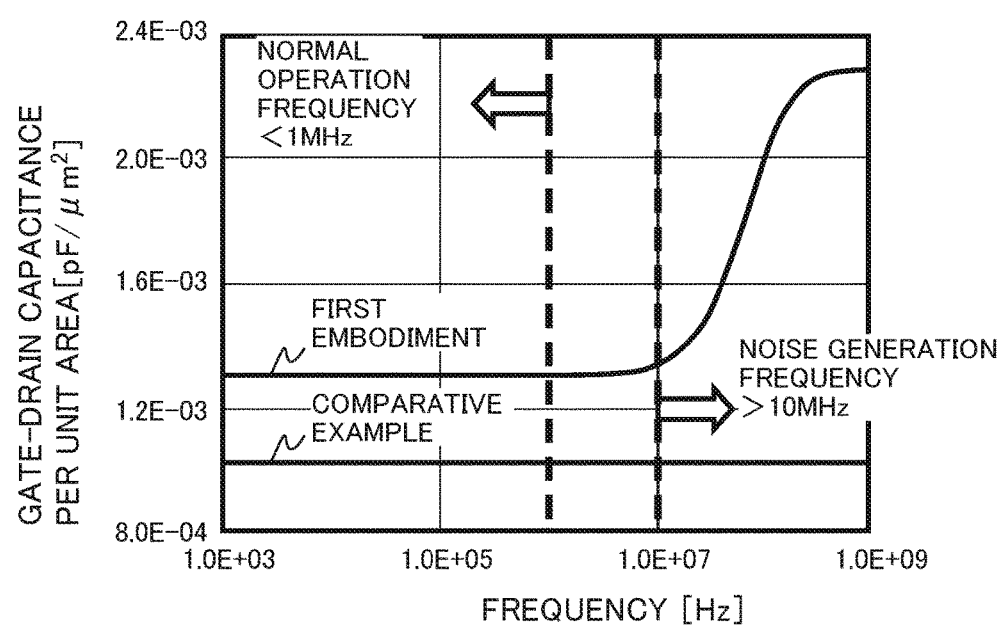
FIG. 13 is an explanatory diagram of functions and effects of the semiconductor device of the first embodiment.

FIG. 13 is a diagram illustrating simulation results. FIG. 13 illustrates the frequency dependency of the effective gate-drain capacitance (Cgd') per unit area.

In the case of the comparative example, there is no parasitic capacitance region, and thus the effective gate-drain capacitance (Cgd') is constant regardless of the frequency. In contrast, in the case of the first embodiment, the gate resistance (Rgp) and the p pillar resistance (Rsp) are connected between the transistor region and the parasitic capacitance region, and thus the effective gate-drain capacitance (Cgd') has frequency dependency. The effective gate-drain capacitance (Cgd') becomes large in a high frequency region.

In a normal switching operation region of the MOSFET 100, that is, in a region where the frequency is 1 MHz or less, the effective gate-drain capacitance (Cgd') is small. On the other hand, the effective gate-drain capacitance (Cgd') becomes large in the high frequency region where the electromagnetic wave noise is generated, that is, in the region where the frequency is 10 MHz or more.

Therefore, during the normal switching operation of the MOSFET 100, the effective gate-drain capacitance (Cgd') is small, and thus the decrease in the switching operation speed is suppressed. On the other hand, the effective gate-drain capacitance (Cgd') is large in the high frequency region where the electromagnetic wave noise is generated, and thus generation of the electromagnetic wave noise is suppressed. In other words, the parasitic capacitance region functions as a snubber circuit that absorbs high-frequency voltage/current change, and suppresses generation of the electromagnetic wave noise.

FIGS. 14A and 14B are explanatory diagrams of the frequency dependence of the effective gate-drain capacitance (Cgd') of the MOSFET 100. FIG. 14A is an explanatory diagram of the capacitance of the gate electrode in a low frequency region, and FIG. 14B is an explanatory diagram of the capacitance of the gate electrode in a high frequency region.

The magnitude relationship of between the p pillar resistance (Rsp) of the MOSFET 100 and impedance of the drain-source capacitance (Cdsp) varies depending on the frequency. Therefore, the gate electrode is coupled to the source electrode in the low frequency region, and the gate electrode is coupled to the drain electrode in the high frequency region. Therefore, the effective gate-drain capacitance (Cgd') becomes large in the high frequency region.

Figure 15A:
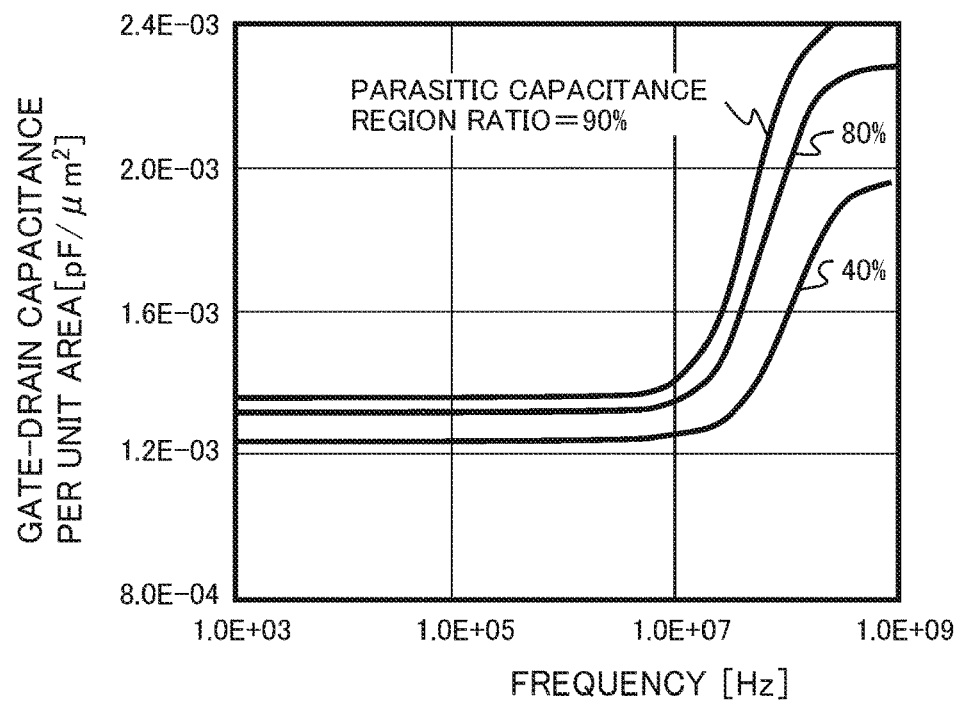
FIGS. 15A and 15B are explanatory diagrams of functions and effects of the semiconductor device of the first embodiment.
Figure 15B:
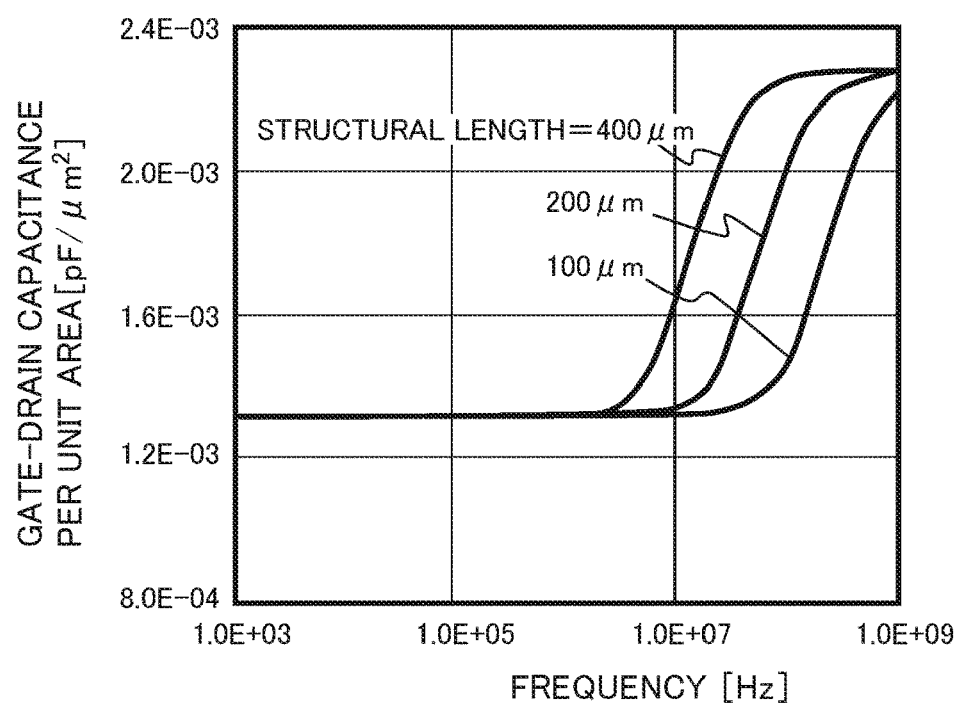

FIGS. 15A and 15B are diagrams illustrating the frequency dependency of the effective gate-drain capacitance (Cgd') when the parasitic capacitance region ratio (Lb/L) and the structural length (L) of the MOSFET 100 are changed. FIG. 15A illustrates a case where the parasitic capacitance region ratio (Lb/L) of the MOSFET 100 is changed, and FIG. 15B illustrates a case where the structural length (L) of the MOSFET 100 is changed.

FIG. 15A illustrates a case where the structural length (L) is fixed at 200 μm and the parasitic capacitance region ratio (Lb/L) is changed to 40%, 80%, and 90%. FIG. 15B illustrates a case where the parasitic capacitance region ratio (Lb/L) is fixed to 80% and the structural length (L) is changed to 100 μm, 200 μm, and 400 μm.

As is clear from FIG. 15A, the magnitude of the effective gate-drain capacitance (Cgd') can be controlled by changing the parasitic capacitance region ratio (Lb/L). On the other hand, as is clear from FIG. 15B, the frequency at which the effective gate-drain capacitance (Cgd') begins to increase can be controlled by changing the structural length (L). Therefore, according to the first embodiment, the electromagnetic wave noise can be suppressed while the decrease in the switching operation speed is suppressed by selecting the appropriate parasitic capacitance region ratio (Lb/L) and the structural length (L).

According to the MOSFET 100 of the first embodiment, providing the parasitic capacitance region enables suppression of electromagnetic wave noise at the time of the switching operation while suppressing a decrease in the switching operation speed.

(Second Embodiment)

A semiconductor device of a second embodiment is similar to that of the first embodiment except that contacts of a source electrode in a transistor region are not provided in a stripe manner but in a dot manner. Hereinafter, content of description overlapping with the first embodiment will be partially omitted.

Figure 16:
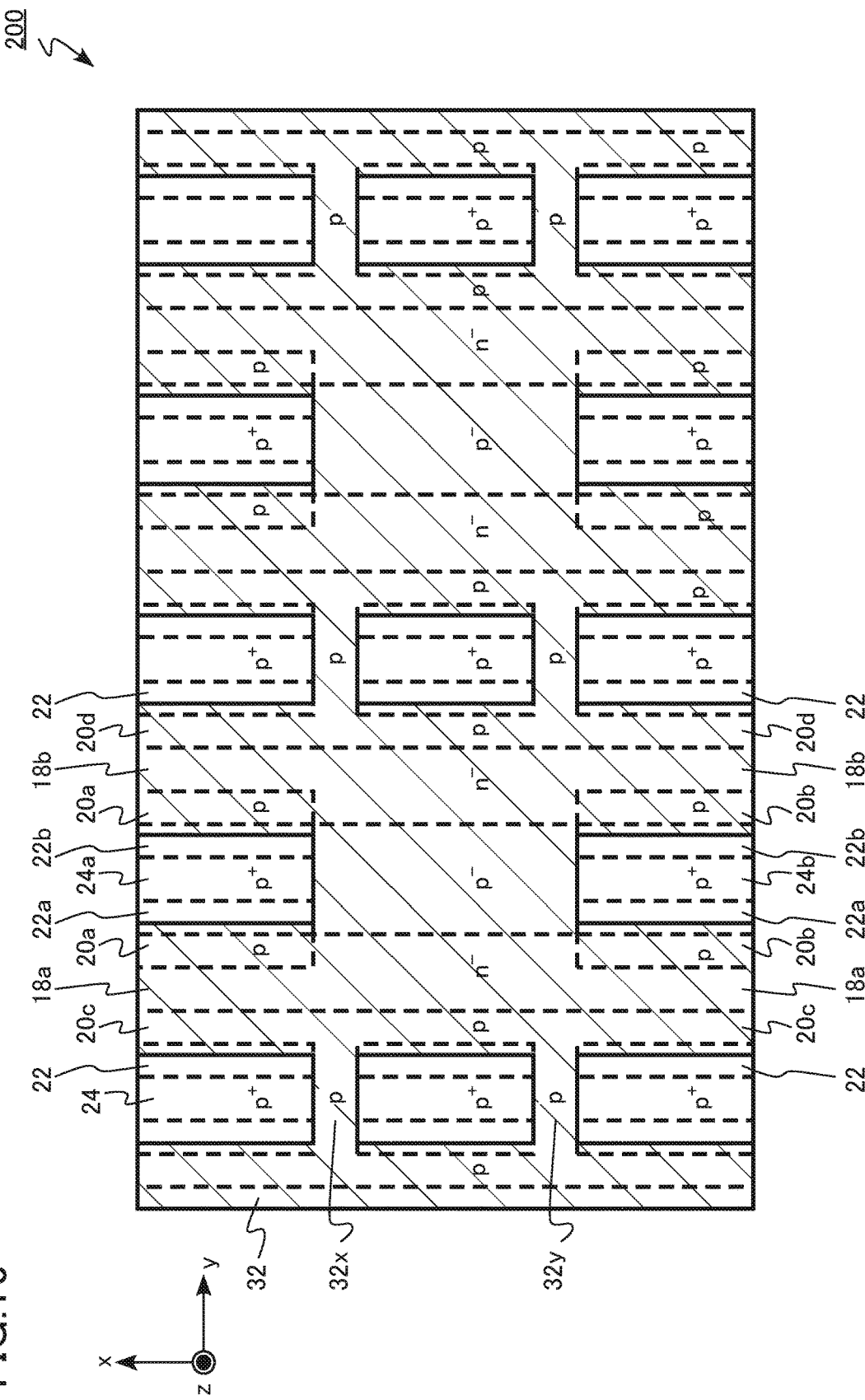
FIG. 16 is a schematic plan view of a semiconductor device of a second embodiment.

FIG. 16 is a schematic plan view of the semiconductor device of the second embodiment. FIG. 16 illustrates a pattern of a gate electrode of the semiconductor device and a pattern of semiconductor regions at a position of an upper plane of the semiconductor device. The pattern of the gate electrode is hatched. Further, the pattern of the semiconductor regions is indicated by the broken lines.

The semiconductor device of the second embodiment is a vertical MOSFET 200 having an SJ structure. The MOSFET 200 is a planar gate-type MOSFET having a MOS structure on a surface of a semiconductor layer.

In the MOSFET 200, a gate electrode 32 includes the bridge regions 32x and 32y and thus the contact of a source electrode 38 in the transistor region to a contact region 24 is divided and the contacts are arranged in a dot manner. In other words, contacts of the source electrode 38 in the transistor region to the contact region 24 are intermittently provided in an x direction.

According to the MOSFET 200 of the second embodiment, the electromagnetic wave noise at the time of the switching operation can be suppressed while the decrease in the switching operation speed is suppressed by providing the parasitic capacitance region, similarly to the first embodiment. Further, the gate electrode 32 includes the bridge regions 32x and 32y, and thus an effective gate-drain capacitance (Cgd') can be increased. Therefore, electromagnetic wave noise at the time of a switching operation can be further suppressed than the first embodiment.

(Third Embodiment)

A semiconductor device according to a third embodiment includes a semiconductor layer having a first plane and a second plane; a first semiconductor region of a first conductivity type provided in the semiconductor layer and extending in a first direction; a second semiconductor region of a second conductivity type provided in the semiconductor layer and extending in the first direction; a third semiconductor region of the second conductivity type provided in the semiconductor layer, extending in the first direction, and the first semiconductor region interposed between the third semiconductor region and the second semiconductor region; a first well region of the first conductivity type provided between the first semiconductor region and the first plane, and having higher first conductivity-type impurity concentration than the first semiconductor region; a second well region of the first conductivity type provided between the first semiconductor region and the first plane, having higher first conductivity-type impurity concentration than the first semiconductor region, and separated from the first well region in the first direction; a first source region of the second conductivity type provided between the first well region and the first plane; a second source region of the second conductivity type provided between the first well region and the first plane; a first contact region of the first conductivity type provided between the first well region and the first plane and provided between the first source region and the second source region, and having higher first conductivity-type impurity concentration than the first well region; a third source region of the second conductivity type provided between the second well region and the first plane; a fourth source region of the second conductivity type provided between the second well region and the first plane; a second contact region of the first conductivity type provided between the second well region and the first plane and provided between the third source region and the fourth source region, and having higher first conductivity-type impurity concentration than the second well region; a gate electrode having a first gate region, a second gate region, a third gate region, a fourth gate region, and a fifth gate region provided in the semiconductor layer, extending in the first direction, the first well region provided between the first gate region and the second gate region, the second well region provided between the third gate region and the fourth gate region, and the fifth gate region provided between the first well region and the second well region; a first insulating film provided between the first gate region and the first well region; a second insulating film provided between the second gate region and the first well region; a third insulating film provided between the third gate region and the second well region; a fourth insulating film provided between the fourth gate region and the second well region; a fifth insulating film provided between the fifth gate region and the first semiconductor region; a source electrode having a first region and a second region, the first region being in contact with the first source region, the second source region, and the first contact region, and the second region being in contact with the third source region, the fourth source region, and the second contact region; and a drain electrode in contact with the second plane. Then, a sixth insulating film and a seventh insulating film are further included, the gate electrode has a sixth gate region provided in the semiconductor layer between the first gate region and the third gate region, and a seventh gate region provided in the semiconductor layer between the second gate region and the fourth gate region, the fifth gate region is interposed between the sixth gate region and the seventh gate region, the sixth insulating film is provided between the sixth gate region and the second semiconductor region, the seventh insulating film is provided between the seventh gate region and the third semiconductor region, and a width of the fifth gate region in a second direction orthogonal to the first direction is smaller than a width of the first semiconductor region in the second direction.

The semiconductor device of the third embodiment is different from that of the first embodiment in having a trench gate structure. Hereinafter, content of description overlapping with the first embodiment will be partially omitted.

Figure 17:
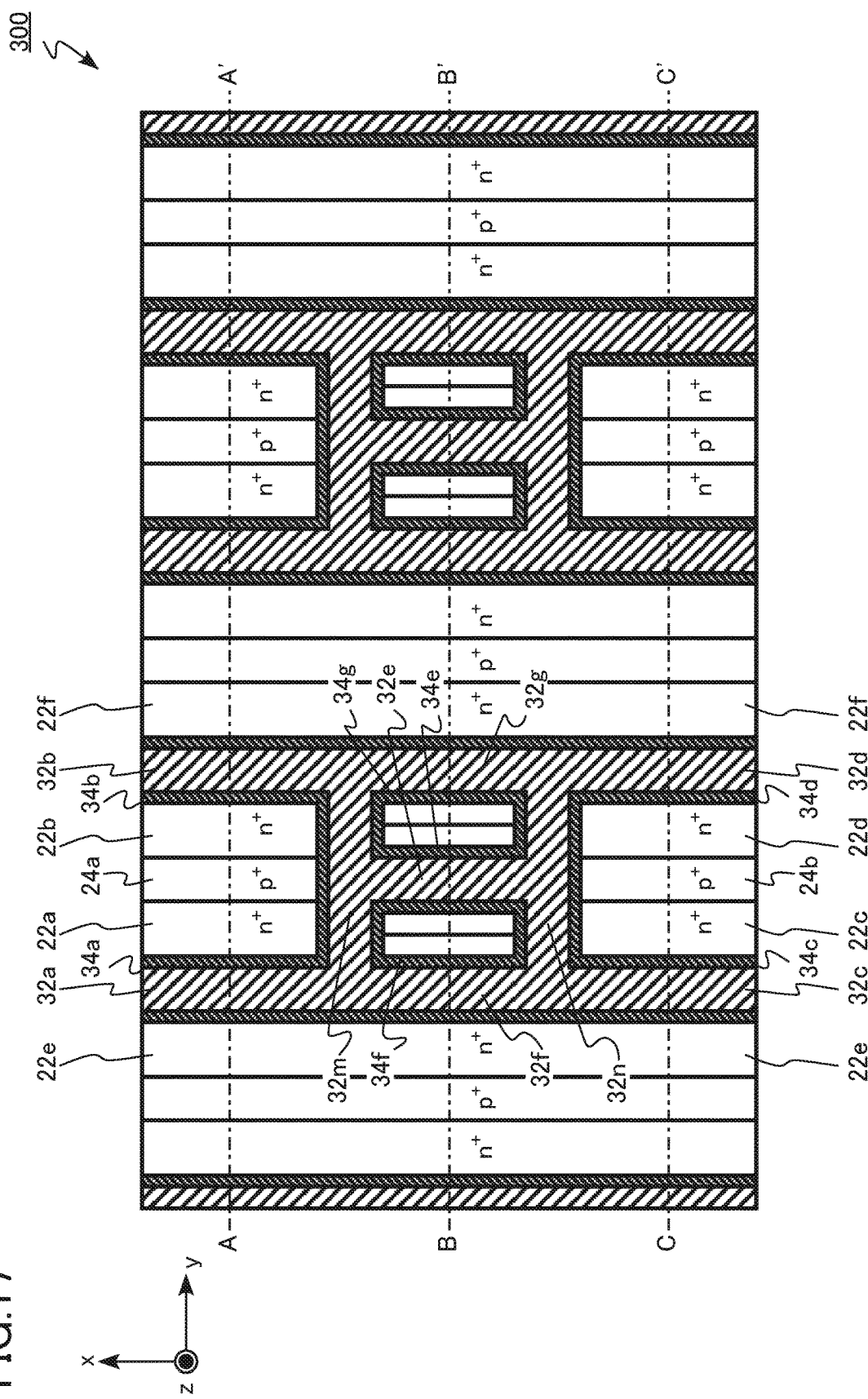
FIG. 17 is a schematic plan view of a semiconductor device of a third embodiment.
Figure 18:
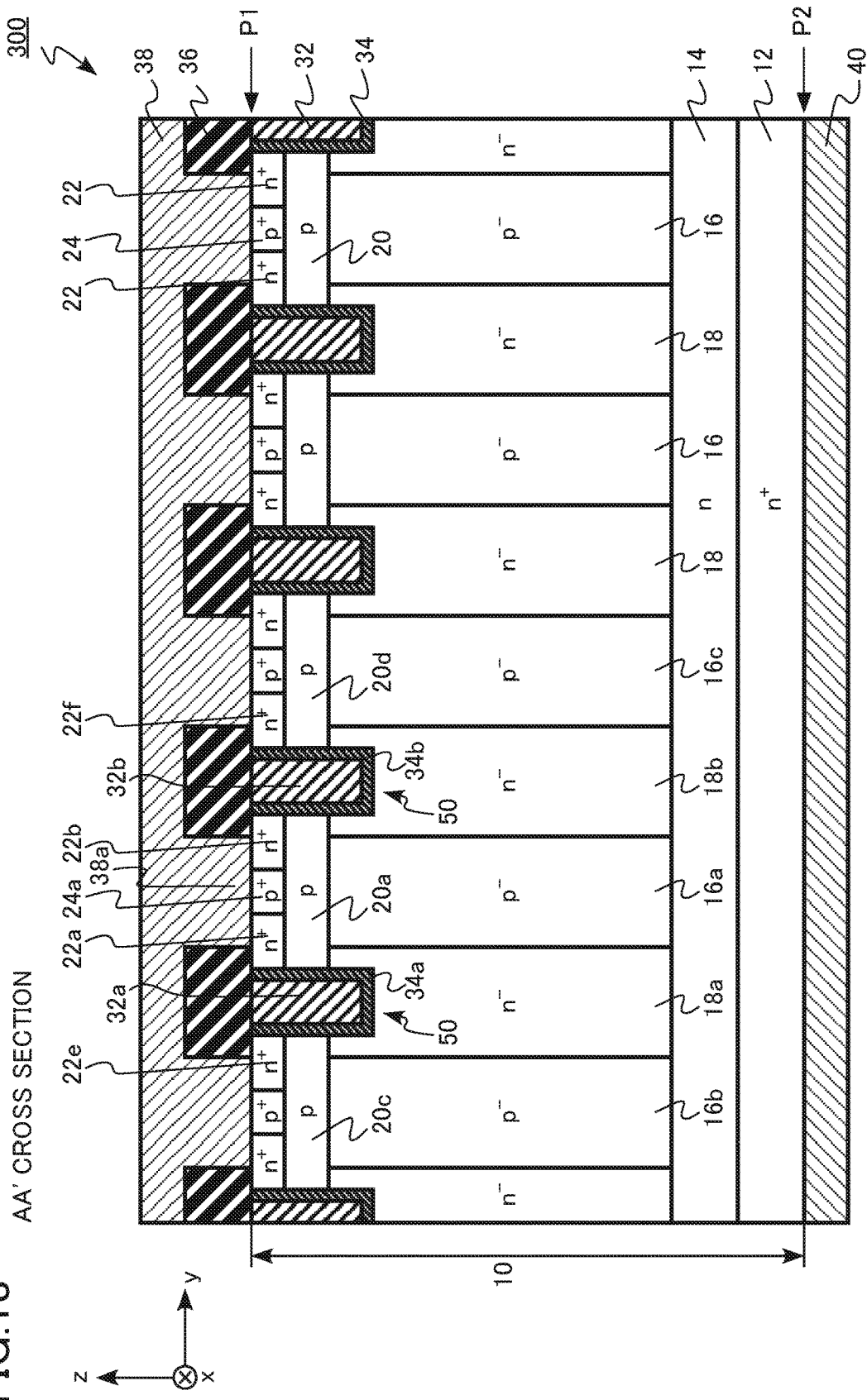
FIG. 18 is a schematic sectional view of a semiconductor device of the third embodiment.
Figure 19:
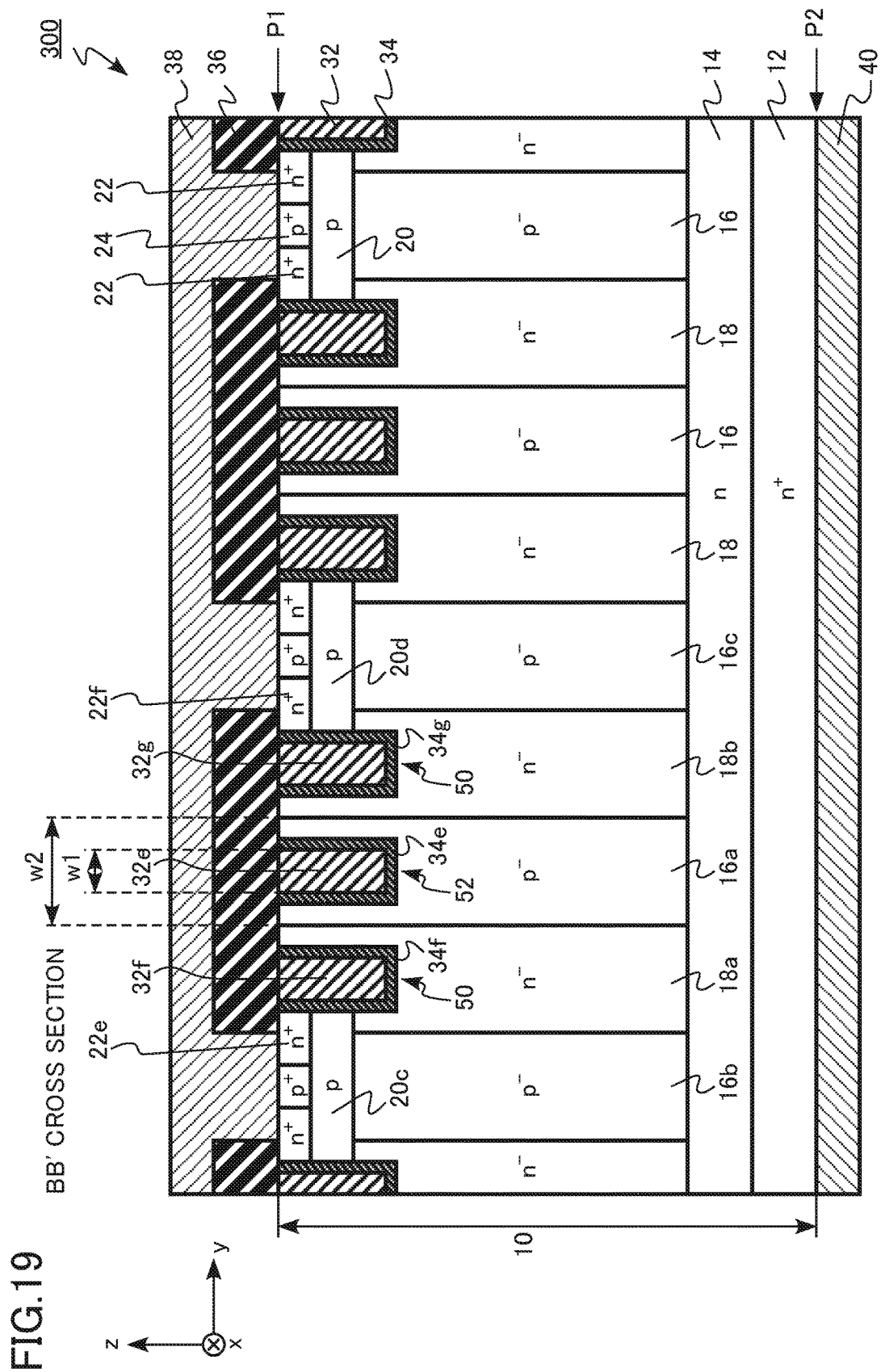
FIG. 19 is a schematic sectional view of a semiconductor device of the third embodiment.
Figure 20:
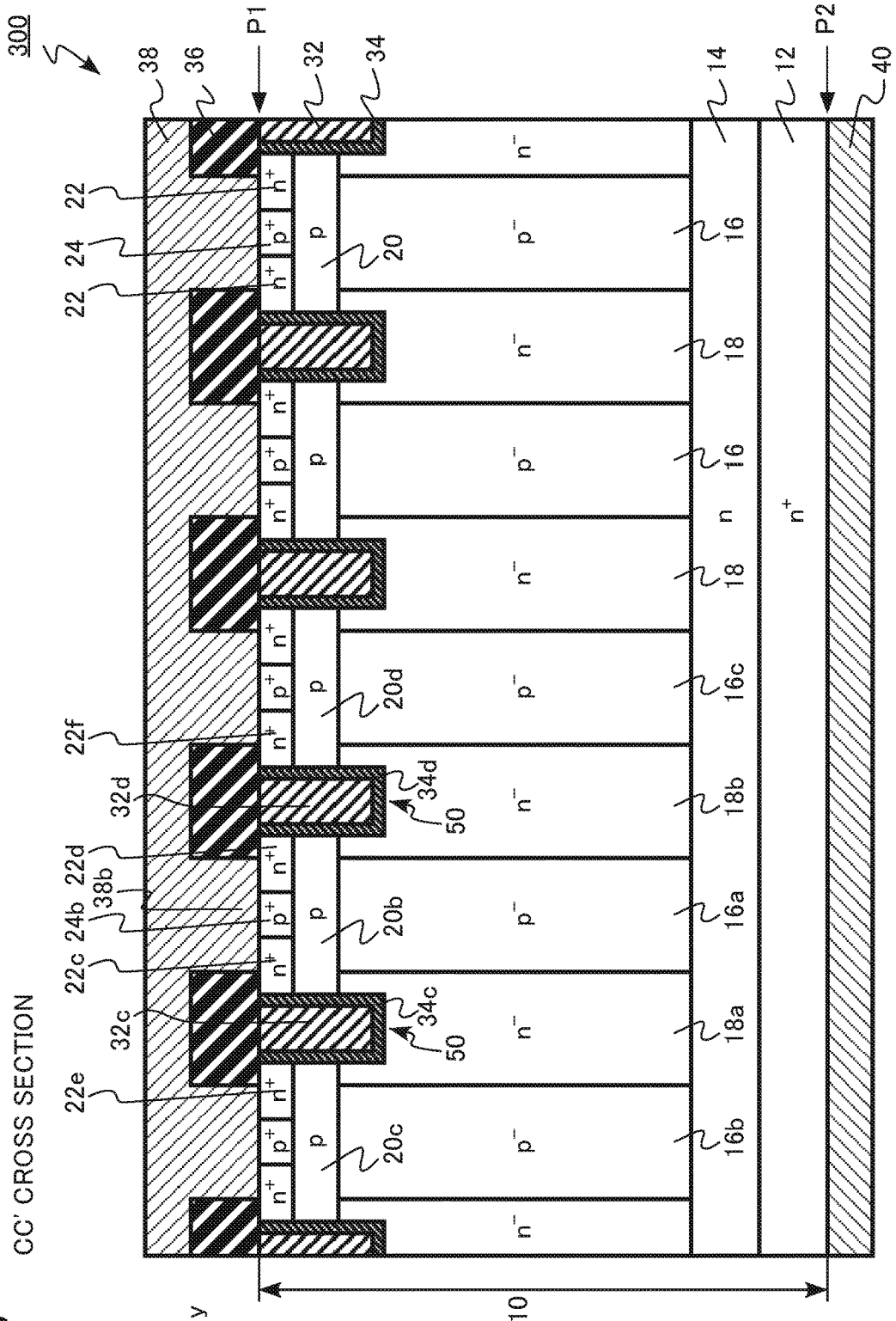
FIG. 20 is a schematic sectional view of a semiconductor device of the third embodiment.

FIG. 17 is a schematic plan view of the semiconductor device of the third embodiment. FIGS. 18, 19, and 20 are schematic sectional views of the semiconductor device of the third embodiment.

FIG. 17 illustrates patterns of the gate electrode and the gate insulating film of the semiconductor device and a pattern of the semiconductor regions at a position of an upper plane (the first plane P1 in FIG. 18) of the semiconductor device. The patterns of the gate electrode and the gate insulating film are hatched.

FIGS. 18, 19, and 20 are sectional views of a plane parallel to the yz plane. FIG. 18 is an A-A' sectional view of FIG. 17. FIG. 19 is a B-B' sectional view of FIG. 17. FIG. 20 is a C-C' sectional view of FIG. 17.

The semiconductor device of the third embodiment is a vertical MOSFET 300 having an SJ structure. The MOSFET 300 is a trench gate-type MOSFET in which a gate electrode is provided in a trench formed in a semiconductor layer.

The MOSFET 300 is an n-type MOSFET using electrons as carriers. In the third embodiment, the first conductivity type is a p type and the second conductivity type is an n type.

The MOSFET 300 includes a semiconductor layer 10, an n+-type drain region 12, an n-type buffer region 14, a p−-type p pillar region 16, an n−-type n pillar region 18, a p-type well region 20, an n+-type source region 22, a p+-type contact region 24, a gate electrode 32, a gate insulating film 34, an interlayer insulating film 36, a source electrode 38, a drain electrode 40, a trench 50, and a dummy trench 52.

A first p pillar region 16a (first semiconductor region), a second p pillar region 16b (fourth semiconductor region), and a third p pillar region 16c (fifth semiconductor region) are ones in the p pillar region 16. A first n pillar region 18a (second semiconductor region) and a second n pillar region 18b (third semiconductor region) are ones in the n pillar region 18.

A first well region 20a, a second well region 20b, a third well region 20c, and a fourth well region 20d are ones in the well region 20. A first source region 22a, a second source region 22b, a third source region 22c, a fourth source region 22d, a fifth source region 22e, and a sixth source region 22f are ones in the source region 22. A first contact region 24a and a second contact region 24b are ones in the contact region 24.

A first gate region 32a, a second gate region 32b, a third gate region 32c, a fourth gate region 32d, a fifth gate region 32e, a sixth gate region 32f, a seventh gate region 32g, a first connection region 32m, and a second connection region 32n are parts of the gate electrode 32. A first insulating film 34a, a second insulating film 34b, a third insulating film 34c, a fourth insulating film 34d, a fifth insulating film 34e, a sixth insulating film 34f, and a seventh insulating film 34g are ones in the gate insulating film 34 or parts of the gate insulating film 34.

The semiconductor layer 10 has a first plane (P1 in FIG. 18) and a second plane (P2 in FIG. 18) facing the first plane P1. In FIG. 1, the first plane P1 is an upper plane in the figure and the second plane P2 is a lower plane in the figure.

The semiconductor layer 10 is made of, for example, single crystal silicon.

The n+-type drain region 12 is provided in the semiconductor layer 10. The drain region 12 is provided in contact with the second plane P2 of the semiconductor layer 10.

The drain region 12 contains n-type impurities. The n-type impurities are, for example, phosphorus (P). The n-type impurity concentration is, for example, from $1\times10^{18}$ cm$^{-3}$ to $1\times10^{21}$ cm$^{-3}$, both inclusive.

The drain region 12 is electrically connected to the drain electrode 40. The drain region 12 has a function to reduce a contact resistance between the semiconductor layer 10 and the drain electrode 40.

The n-type buffer region 14 is provided in the semiconductor layer 10. The buffer region 14 is provided on the drain region 12.

The buffer region 14 contains n-type impurities. The n-type impurities are, for example, phosphorus (P).

The n-type impurity concentration of the buffer region 14 is lower than the n-type impurity concentration of the drain region 12. The n-type impurity concentration is, for example, from $1\times10^{15}$ cm$^{-3}$ to $1\times10^{17}$ cm$^{-3}$, both inclusive.

The buffer region 14 has a function to suppress a depletion layer extending at the time of an off operation of the MOSFET 300.

A plurality of p−-type p pillar regions 16 is provided between the drain region 12 and the first plane P1. The p pillar region 16 is provided on the buffer region 14.

The p pillar region 16 extends in an x direction (a first direction). The p pillar region 16 has a flat plate shape parallel to an xz plane. A distance (the depth of the p pillar region 16) from an end portion of the p pillar region 16 on a side of the first plane P1 to an end portion of the p pillar region 16 on a side of the second plane P2 is, for example, 20 μm or more.

The p pillar region 16 contains p-type impurities. The p-type impurities are, for example, boron (B). The p-type impurity concentration is, for example, from $1\times10^{15}$ cm$^{-3}$ to $8\times10^{16}$ cm$^{-3}$, both inclusive. The p-type impurity concentration of the p pillar region 16 in a depth direction is approximately constant.

A plurality of n−-type n pillar regions 18 is provided between the drain region 12 and the first plane P1. The n pillar region 18 is provided on the buffer region 14. The n pillar region 18 is provided between the p pillar regions 16.

The n pillar region 18 extends in the x direction. The n pillar region 18 has a flat plate shape parallel to the xz plane.

The n pillar region 18 contains n-type impurities. The n-type impurities are, for example, phosphorus (P).

The n-type impurity concentration of the n pillar region 18 is, for example, from $1\times10^{15}$ cm$^{-3}$ to $8\times10^{16}$ cm$^{-3}$, both inclusive. The n-type impurity concentration of the n pillar region 18 is approximately constant in the depth direction.

The n pillar region 18 functions as a current path at the time of an on operation of the MOSFET 300.

The p pillar region 16 and the n pillar region 18 are alternately disposed in a y direction (second direction). The p pillar region 16 and the n pillar region 18 form the SJ structure. With the SJ structure, the breakdown voltage is improved and the on-resistance is reduced in the MOSFET 300 A disposition pitch of the p pillar region 16 and the n pillar region 18 in the y direction is, for example, from 4 μm to 20 μm, both inclusive.

The first p pillar region 16a (first semiconductor region) is sandwiched between the first n pillar region 18a (second semiconductor region) and the second n pillar region 18b (third semiconductor region). The first n pillar region 16a (second semiconductor region) is sandwiched between the first p pillar region 16a (first semiconductor region) and the second p pillar region 16h (fourth semiconductor region). The second n pillar region 18b is sandwiched between the first p pillar region 16a (first semiconductor region) and the third p pillar region 16c (fifth semiconductor region).

The first p pillar region 16a (first semiconductor region) and the first n pillar region 18a (second semiconductor region), the first p pillar region 16a (first semiconductor region) and the second n pillar region 18b (third semiconductor region), the first n pillar region 18a (second semiconductor region) and the second p pillar region 16b (fourth semiconductor region), the second n pillar region 18b (third semiconductor region) and the third p pillar region 16c (fifth semiconductor region) are in contact with each other.

The p-type well region 20 is provided between the p pillar region 16 and the first plane P1. The well region 20 extends in the x direction.

The well region 20 contains p-type impurities. The p-type impurities are, for example, boron (B). The p-type impurity concentration of the well region 20 is higher than the p-type impurity concentration of the p pillar region 16. The p-type impurity concentration is, for example, from $5\times10^{16}$ cm$^{-3}$ to $5\times10^{18}$ cm$^{-3}$, both inclusive.

An inversion layer is formed in a region of the well region 20, the region facing the gate electrode 32, at the time of an on operation of the MOSFET 300. The inversion layer functions as a channel of the MOSFET 300.

The first well region 20a is provided between the p pillar region 16a (first semiconductor region) and the first plane P1. The second well region 20b is provided between the p pillar region 16a (first semiconductor region) and the first plane P1.

The first well region 20a and the second well region 20b are separated in the x direction (first direction). In other words, the well region 20 does not exist between the first well region 20a and the second well region 20b, and the p pillar region 16a is in contact with the first plane P1.

The third well region 20c is provided between the p pillar region 16b (fourth semiconductor region) and the first plane P1. The fourth well region 20d is provided between the p pillar region 16c (fifth semiconductor region) and the first plane P1. The third well region 20c and the fourth well region 20d extend an the x direction (first direction).

The $n^+$-type source region 22 is provided between the well region 20 and the first plane P1. The source region 22 extends in the x direction (first direction). The source region 22 contains n-type impurities. The n-type impurities are, for example, phosphorus (P). The n-type impurity concentration is, for example, from $1\times10^{18}$ cm$^{-3}$ to $1\times10^{22}$ cm$^{-3}$, both inclusive.

The source region 22 is electrically connected to the source electrode 38.

The first source region 22a is provided between the first well region 20a and the first plane P1. The second source region 22b is provided between the first well region 20a and the first plane P1. The third source region 22c is provided between the second well region 20b and the first plane P1. The fourth source region 22d is provided between the second well region 20b and the first plane P1.

The fifth source region 22e is provided between the third well region 20c and the first plane P1. The sixth source region 22f is provided between the fourth well region 20d and the first plane P1.

The first source region 22a, the second source region 22b, the third source region 22c, the fourth source region 22d, the fifth source region 22e, and the sixth source region 22f extend in the a direction.

The $p^+$-type contact region 24 is provided between the well region 20 and the first plane P1. The contact region 24 is provided adjacent to the source region 22. The contact region 24 extends in the x direction.

The contact region 24 contains p-type impurities. The p-type impurities are, for example, boron (B). The p-type impurity concentration is, for example, from $1\times10^{18}$ cm$^{-3}$ to $1\times10^{22}$ cm$^{-3}$, both inclusive.

The contact region 24 is electrically connected to the source electrode 38. The contact region 24 has a function to reduce a contact resistance between the semiconductor layer 10 and the source electrode 38.

The first contact region 24a is provided between the first source region 22a and the second source region 22b. The first contact region 24a is provided between the first well region 20a and the first plane P1.

The second contact region 24b is provided between the third source region 22c and the fourth source region 22d. The second contact region 24b is provided between the second well region 20b and the first plane P1.

The trench 50 is formed in the semiconductor layer 10. The trench 50 extends in the x direction. The dummy trench 52 is formed in the semiconductor layer 10. The dummy trench 52 extends in the x direction.

At least a part of the gate electrode 32 is provided inside the trench 50 or the dummy trench 52 formed in the semiconductor layer 10. The gate electrode 32 is a conductive layer. The gate electrode 32 extends in the x direction (first direction). The gate electrode 32 is made of, for example, polycrystalline silicon containing n-type impurities or p-type impurities.

The gate electrode 32 includes the first gate region 32a, the second gate region 32b, the third gate region 32c, the fourth gate region 32d, the fifth gate region 32e, the sixth gate region 32f, the seventh gate region 32g, the first connection region 32m, and the second connection region 32n. The first gate region 32a, the second gate region 32b, the third gate region 32c, the fourth gate region 32d, the fifth gate region 32e, the sixth gate region 32f, the seventh gate region 32g, the first connection region 32m, and the second connection region 32n are provided in the semiconductor layer 10.

The first well region 20a is provided between the first gate region 32a and the second gate region 32b. The second well region 20b is provided between the third gate region 32c and the fourth gate region 32d. The fifth gate region 32e is provided between the first well region 20a and the second well region 20b.

The sixth gate region 32f is provided between the first gate region 32a and the third gate region 32c. The seventh gate region 32g is provided between the second gate region 32b and the fourth gate region 32d. The fifth gate region 32e is sandwiched between the sixth gate region 32f and the seventh gate region 32g.

The width (w1 in FIG. 19) of the fifth gate region 32e in a y direction (second direction) orthogonal to an x direction (first direction) is smaller than the width (w2 in FIG. 19) of the first p pillar region 16a (first semiconductor region)) in the y direction (second direction).

The fifth gate region 32e, the sixth gate region 32f, and the seventh gate region 32g are connected by the first connection region 32m and the second connection region 32n.

The gate insulating film 34 is provided between the gate electrode 32 and the semiconductor layer 10. At least a part of the gate insulating film 34 is provided inside the trench 50 or the dummy trench 52 formed in the semiconductor layer 10. The gate insulating film 34 made of, for example, silicon oxide.

The first insulating film 34a is provided between the first gate region 32a and the first well region 20a. The second insulating film 34b is provided between the second gate region 32b and the first well region 20a. The third insulating film 34c is provided between the third gate region 32c and the second well region 20b. The fourth insulating film 34d is provided between the fourth gate region 32d and the second well region 20b.

The fifth insulating film 34e is provided between the fifth gate region 32e and the first p pillar region 16a (first semiconductor region). The sixth insulating film 34f is provided between the sixth gate region 32f and the first n pillar region 18a (second semiconductor region). The sixth insulating film 34f is provided between the sixth gate region 32f and the third well region 20c. The seventh insulating film 34g is provided between the seventh gate region 32g and the second n pillar region 18b (third semiconductor region). The seventh insulating film 34g is provided between the seventh gate region 32g and the fourth well region 20d.

The interlayer insulating film 36 is provided on the gate electrode 32. The interlayer insulating film 36 is made of, for example, silicon oxide.

The source electrode 38 is in contact with the first plane P1 of the semiconductor layer 10. The source electrode 38 is in contact with the first plane P1 in an opening portion provided in the interlayer insulating film 36. The source electrode 38 is in contact with the source region 22 and the contact region 24. A contact between the source electrode 38, and the source region 22 and the contact region 24 is an ohmic contact.

The source electrode 38 has a first region 38a and a second region 38b. The first region 38a is in contact with the first source region 22a, the second source region 22b, and the first contact region 24a. The second region 38b is in contact with the third source region 22c, the fourth source region 22d, and the second contact region 24b.

The source electrode 38 is made of a metal. The source electrode 38 contains, for example, aluminum (Al).

The drain electrode 40 is in contact with the second plane 92 of the semiconductor layer 10. The drain electrode 40 is in contact with the drain region 12. A contact between the drain electrode 40 and the drain region 12 is an ohmic contact.

The drain electrode 40 is made of a metal. The drain electrode 40 includes, for example, aluminum (Al).

The MOSFET 300 of the third embodiment is not provided with the well region 20 and the contact region 24 on the first p pillar region 16a (first semiconductor region) in the region between the first well region 20a and the second well region 20b, similarly to the MOSFET 100 of the first embodiment. The region between the first well region 20a and the second well region 20b serves as a parasitic capacitance region.

In the MOSFET 300 of the third embodiment, the fifth gate region 32e in the parasitic capacitance region is provided in the dummy trench 52, and thus the gate-source capacitance (Cgsp) in the parasitic capacitance region becomes large. Therefore, an effective gate-drain capacitance (Cgd') of the MOSFET 300 becomes larger than that in the first embodiment.

According to the MOSFET 300 of the third embodiment, electromagnetic wave noise at the time of a switching operation can be suppressed while a decrease in a switching operation speed is suppressed by providing the parasitic capacitance region, similarly to the first embodiment. Further, the fifth gate region 32e in the parasitic capacitance region is provided in the dummy trench 52, and thus the effective gate-drain capacitance (Cgd') can be increased. Therefore, the electromagnetic wave noise at the time of the switching operation can be further suppressed than the first embodiment. In addition, with employment of the trench gate structure, an on-resistance per unit area of the MOSFET 300 is reduced.

(Fourth Embodiment)

The semiconductor device of the fourth embodiment is different from that of the third embodiment in that the width of the fifth gate region in the second direction orthogonal to the first direction is larger than the width of the first semiconductor region in the second direction. Hereinafter, content of description overlapping with the third embodiment will be partially omitted.

Figure 21:
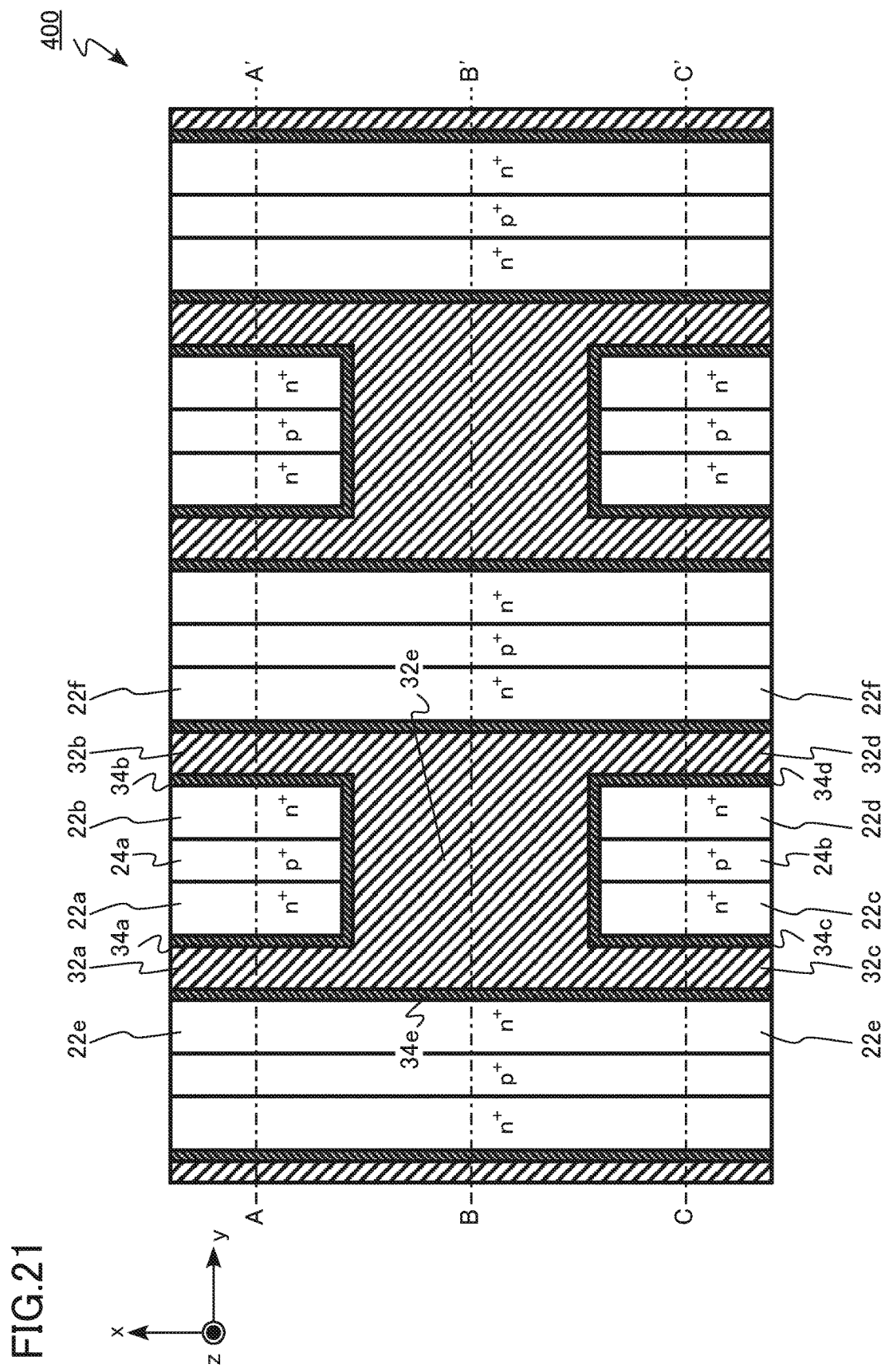
FIG. 21 is a schematic plan view of a semiconductor device of a fourth embodiment.
Figure 22:
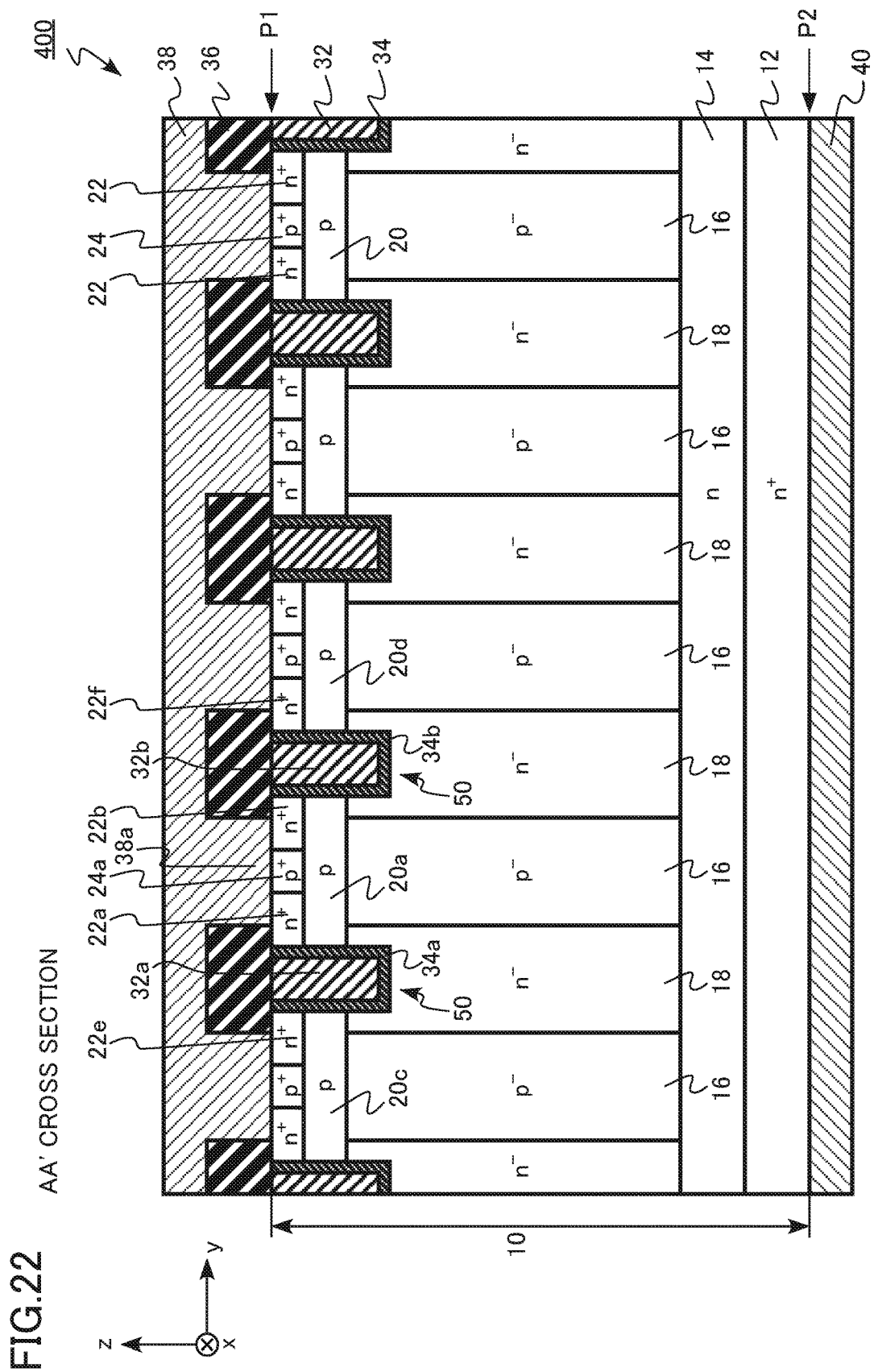
FIG. 22 is a schematic sectional view of a semiconductor device of the fourth embodiment.
Figure 23:
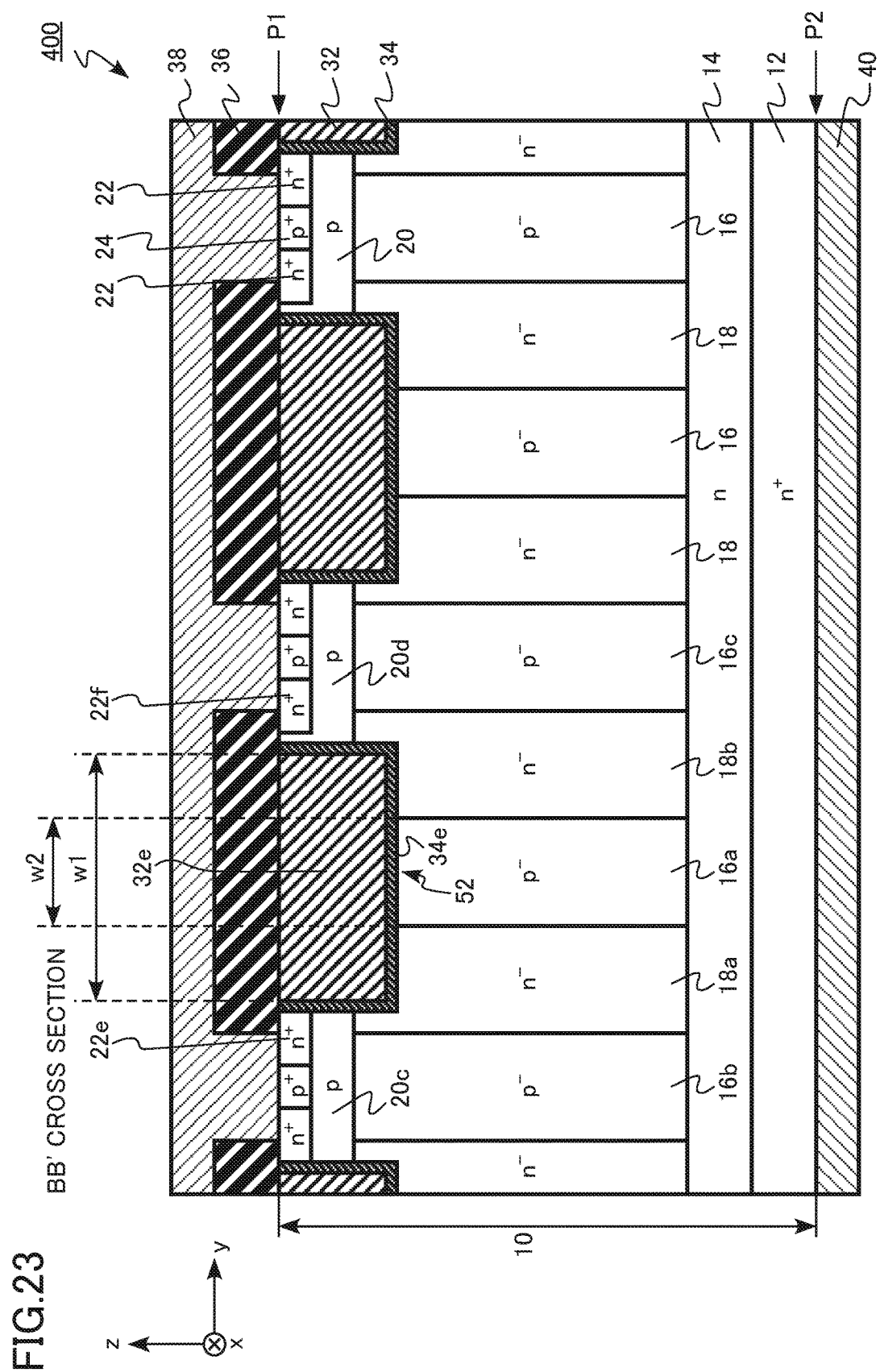
FIG. 23 is a schematic sectional view of a semiconductor device of the fourth embodiment.
Figure 24:
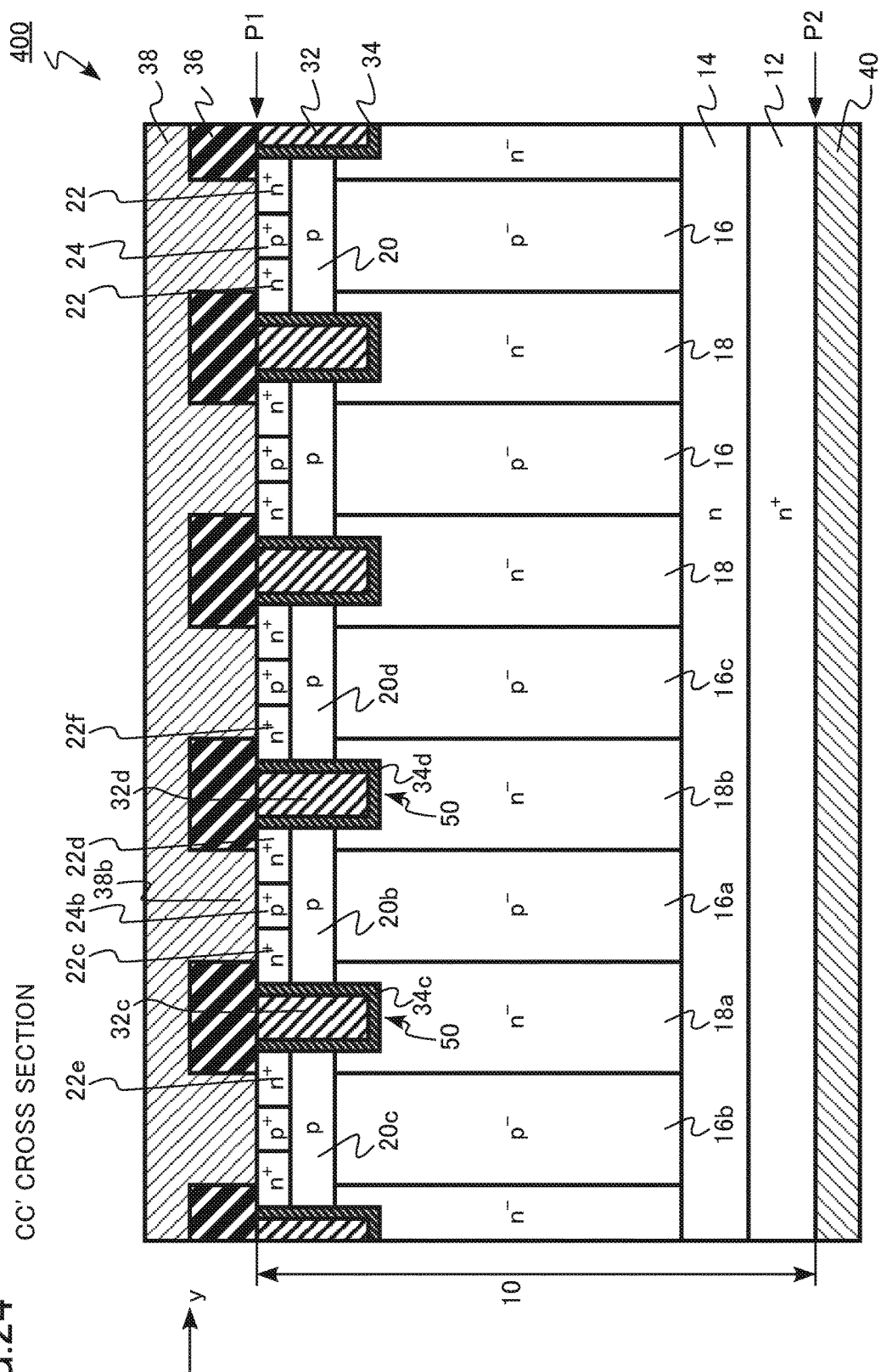
FIG. 24 is a schematic sectional view of a semiconductor device of the fourth embodiment.

FIG. 21 is a schematic plan view of the semiconductor device of the fourth embodiment. FIGS. 22, 23, and 24 are schematic sectional views of the semiconductor device of the fourth embodiment.

FIG. 21 illustrates patterns of a gate electrode and a gate insulating film of the semiconductor device and a pattern of semiconductor regions at a position of an upper plane (first plane P1 in FIG. 22) of the semiconductor device. The patterns of the gate electrode and the gate insulating film are hatched.

FIGS. 22, 23, and 24 are sectional views of a plane parallel to the yz plane. FIG. 22 is an A-A' sectional view of FIG. 21. FIG. 23 is a B-B' sectional view of FIG. 21. FIG. 24 is a C-C' sectional view of FIG. 21.

The semiconductor device of the fourth embodiment is a vertical MOSFET 400 having an SJ structure. The MOSFET 400 is a trench gate-type MOSFET in which a gate electrode is provided in a trench formed in a semiconductor layer.

The MOSFET 400 is an n-type MOSFET using electrons as carriers. In the fourth embodiment, the first conductivity type is a p type and the second conductivity type is an n type.

MOSFET 400 includes a semiconductor layer 10, an $n^+$-type drain region 12, an n-type buffer region 14, a $p^-$-type p pillar region 16, an $n^-$-type n pillar region 18, a p-type well region 20, an $n^+$-type source region 22, a $p^+$-type contact region 24, a gate electrode 32, a gate insulating film 34, an interlayer insulating film 36, a source electrode 38, a drain electrode 40, a trench 50, and a dummy trench 52.

A first p pillar region 16a (first semiconductor region), a second p pillar region 16b (fourth semiconductor region), and a third p pillar region 16c (fifth semiconductor region) are ones in the p pillar region 16. A first n pillar region 18a (second semiconductor region) and a second n pillar region 18b (third semiconductor region) are ones in the n pillar region 18.

A first well region 20a, a second well region 20b, a third well region 20c, and a fourth well region 20d are ones in the well region 20. A first source region 22a, a second source region 22b, a third source region 22c, a fourth source region 22d, a fifth source region 22e, and a sixth source region 22f are ones in the source region 22. A first contact region 24a and a second contact region 24b are ones in the contact region 24.

A first gate region 32a, a second gate region 32b, a third gate region 32c, a fourth gate region 32d, and a fifth gate region 32e are ones of the gate electrode 32. A first insulating film 34a, a second insulating film 34b, a third insulating film 34c, a fourth insulating film 34d, and a fifth insulating film 34e are ones in the gate insulating film 34 or parts of the gate insulating film 34.

The fifth insulating film 34e is provided between the fifth gate region 32e and the first p pillar region 16a (first semiconductor region). The fifth insulating film 34e is provided between the fifth gate region 32e and the third well region 20c. The fifth insulating film 34e is provided between the fifth gate region 32e and the fourth well region 20d.

The width (w1 in FIG. 23) of the fifth gate region 32e in a y direction (second direction) orthogonal to an x direction (first direction) is larger than the width (w2 in FIG. 23) of the first p pillar region 16a (first semiconductor region) in the y direction (second direction).

In the MOSFET 400 of the fourth embodiment, the width (w1 in FIG. 23) of the fifth gate region 32e in the parasitic capacitance region is larger than the width (w2 in FIG. 23) of the first p pillar region 16a (first semiconductor region), and capacitive coupling between the fifth gate region 32e and the first n-type pillar region 18a, and between the fifth gate region 32e and the second n-type pillar region 18b becomes large. Therefore, a gate-drain capacitance (Cgdp) of the parasitic capacitance region becomes large. Therefore, an effective gate-drain capacitance (Cgd') of the MOSFET 400 becomes larger than that of the third embodiment.

According to the MOSFET 400 of the fourth embodiment, electromagnetic wave noise at the time of a switching operation can be suppressed while a decrease in a switching operation speed is suppressed by providing the parasitic capacitance region, similarly to the third embodiment. Further, the effective gate-drain capacitance (Cgd') can be increased by making the width of the fifth gate region 32e larger than the width of the first p pillar region 16a. Therefore, electromagnetic wave noise at the time of a switching operation can be further suppressed than the third embodiment.

(Fifth Embodiment)

A semiconductor device of a fifth embodiment is different from that of the third embodiment in further including an eighth insulating film and a ninth insulating film, and a gate electrode has an eighth gate region provided on a semiconductor layer between a fifth gate region and a sixth gate region, and a ninth gate region provided on the semiconductor layer between the fifth gate region and a seventh gate region, the eighth insulating film is provided between the eighth gate region and a first plane, and the ninth insulating film is provided between the ninth gate region and the first plane. Hereinafter, content of description overlapping with the third embodiment will be partially omitted.

Figure 25:
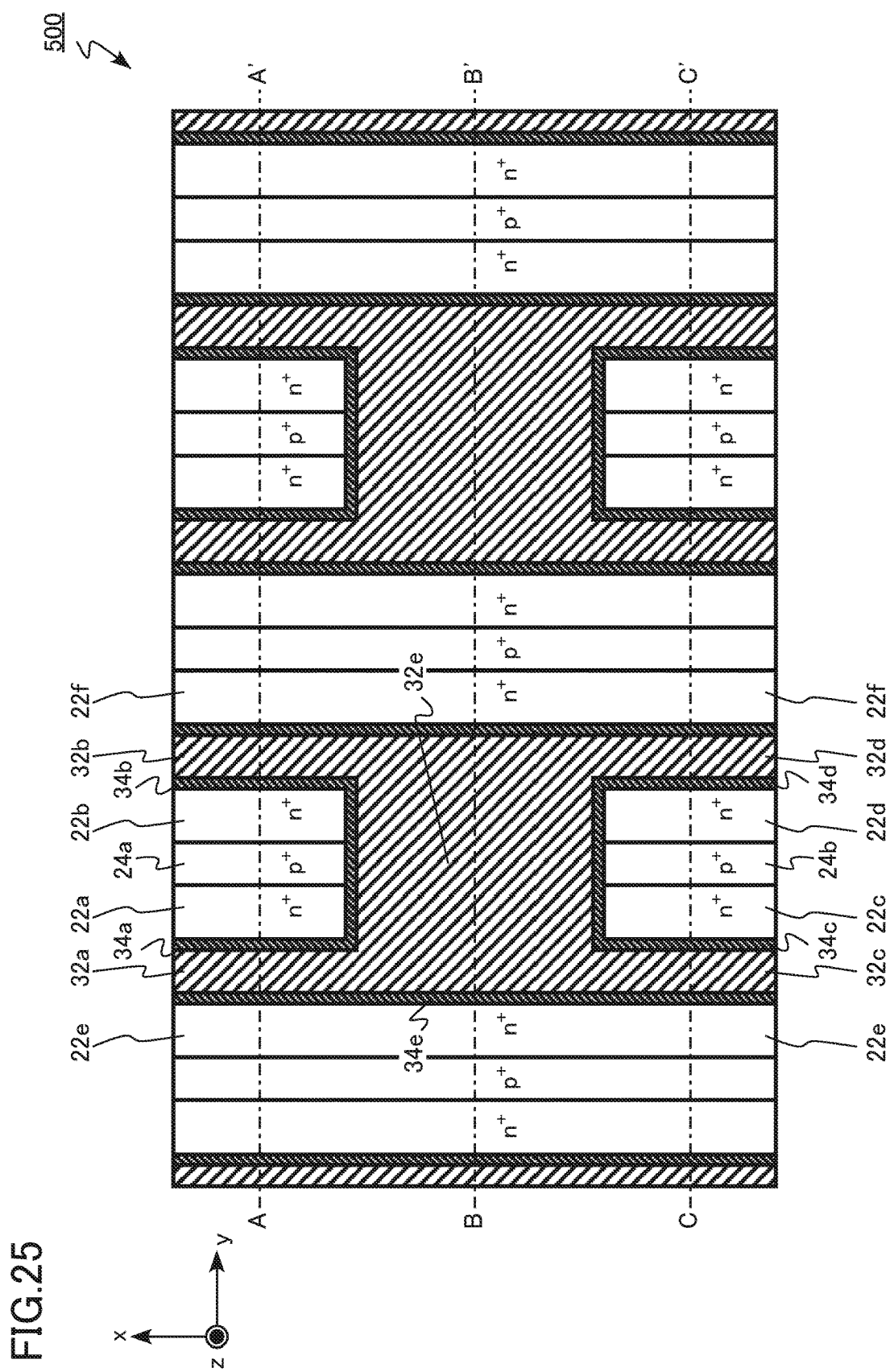
FIG. 25 is a schematic plan view of a semiconductor device of a fifth embodiment.
Figure 26:
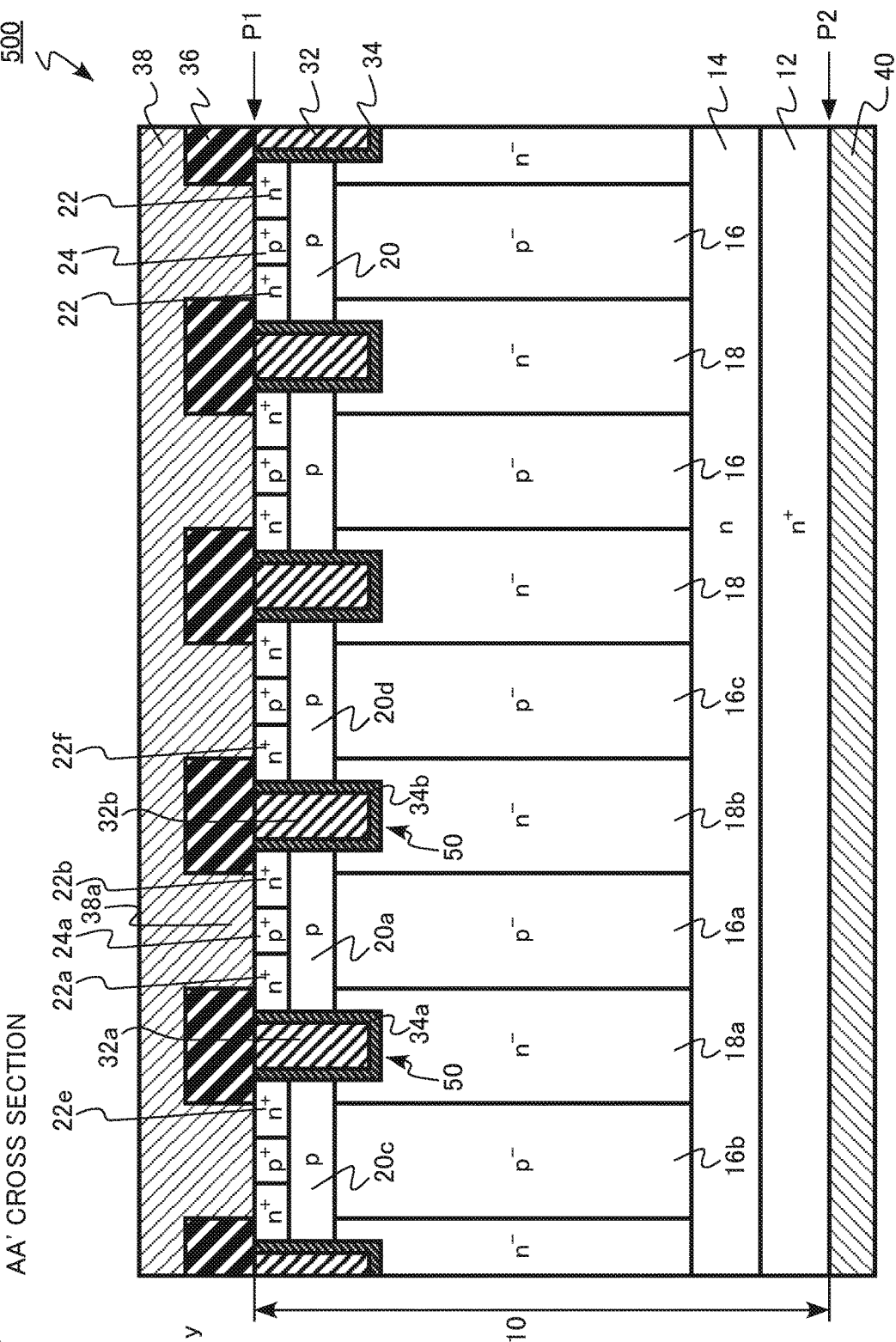
FIG. 26 is a schematic sectional view of a semiconductor device of the fifth embodiment.
Figure 27:
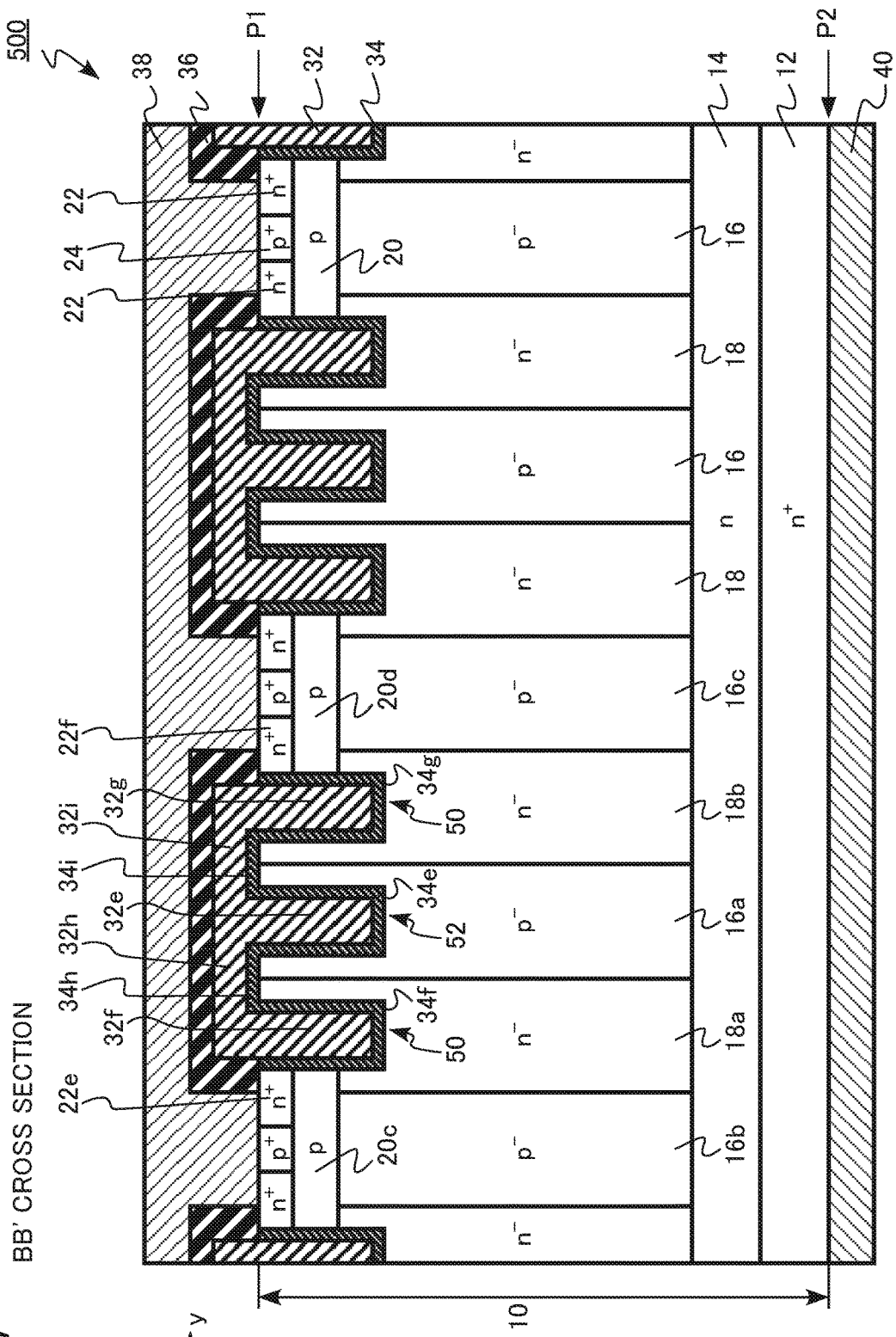
FIG. 27 is a schematic sectional view of a semiconductor device of the fifth embodiment.
Figure 28:
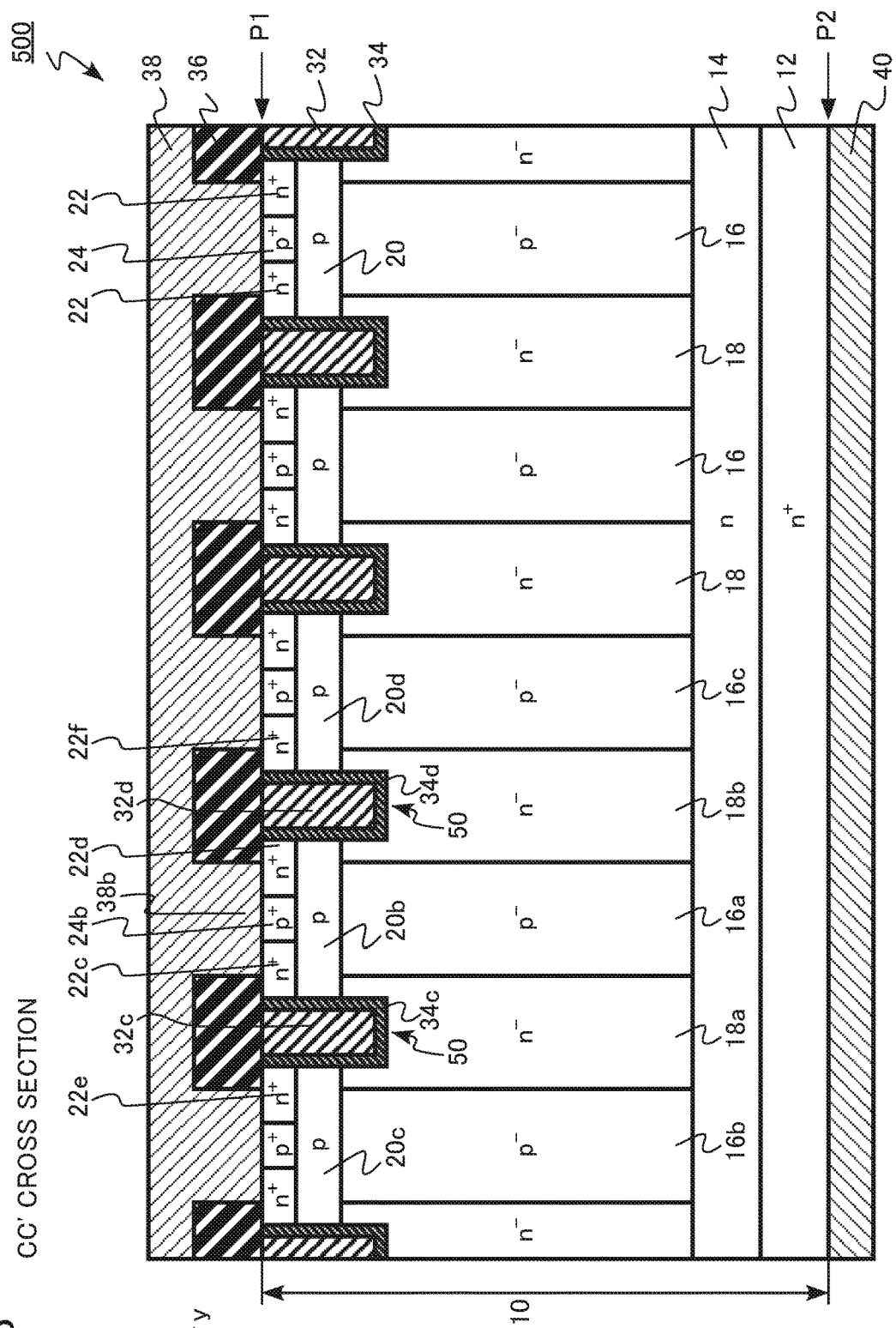
FIG. 28 is a schematic sectional view of a semiconductor device of the fifth embodiment.

FIG. 25 is a schematic plan view of the semiconductor device of the fifth embodiment. FIGS. 26, 27, and 28 are schematic sectional views of the semiconductor device of the fifth embodiment.

FIG. 25 illustrates patterns of a gate electrode and a gate insulating film of the semiconductor device and a pattern of semiconductor regions. The patterns of the gate electrode and the gate insulating film are hatched.

FIGS. 26, 27, and 28 are sectional views of a plane parallel to the yz plane. FIG. 26 is an A-A' sectional view of FIG. 25. FIG. 27 is a B-B' sectional view of FIG. 25. FIG. 28 is a C-C' sectional view of FIG. 25.

The semiconductor device of the fifth embodiment is a vertical MOSFET 500 having an SJ structure. The MOSFET 500 is a trench gate-type MOSFET in which a gate electrode is provided in a trench formed in a semiconductor layer.

The MOSFET 500 is an n-type MOSFET using electrons as carriers. In the fifth embodiment, the first conductivity type is a p type and the second conductivity type is an n type.

MOSFET 500 includes a semiconductor layer 10, an $n^+$-type drain region 12, an n-type buffer region 14, a $p^-$-type p pillar region 16, an $n^-$-type n pillar region 18, a p-type well region 20, an $n^+$-type source region 22, a $p^+$-type contact region 24, a gate electrode 32, a gate insulating film 34, an interlayer insulating film 36, a source electrode 38, a drain electrode 40, a trench 50, and a dummy trench 52.

A first p pillar region 16a (first semiconductor region), a second p pillar region 16b (fourth semiconductor region), and a third p pillar region 16c (fifth semiconductor region) are ones in the p pillar region 16. A first n pillar region 18a (second semiconductor region) and a second n pillar region 18b (third semiconductor region) are ones in the n pillar region 18.

A first well region 20a, a second well region 20b, a third well region 20c, and a fourth well region 20d are ones in the well region 20. A first source region 22a, a second source region 22b, a third source region 22c, a fourth source region 22d, a fifth source region 22e, and a sixth source region 22f are ones in the source region 22. A first contact region 24a and a second contact region 24b are ones in the contact region 24.

A first gate region 32a, a second gate region 32b, a third gate region 32c, a fourth gate region 32d, a fifth gate region 32e, a sixth gate region 32f, a seventh gate region 32g, an eighth gate region 32h, and a ninth gate region 32i are parts of the gate electrode 32. A first insulating film 34a, a second insulating film 34b, a third insulating film 34c, a fourth insulating film 34d, a fifth insulating film 34e, a sixth insulating film 34f, a seventh insulating film 34g, an eighth insulating film 34h, and a ninth insulating film 34i are ones in the gate insulating film 34 or parts of the gate insulating film 34.

The eighth gate region 32h is provided on a semiconductor layer 10 between the fifth gate region 32e and the sixth gate region 32f. The ninth gate region 32i is provided on the semiconductor layer 10 between the fifth gate region 32e and the seventh gate region 32g.

The eighth insulating film 34h is provided between the eighth gate region 32h and a first plane P1. The ninth insulating film 34i is provided between the ninth gate region 32i and the first plane P1.

In the MOSFET 500 of the fifth embodiment, the gate electrode 32 in a parasitic capacitance region has the eighth gate region 32h and the ninth gate region on the semiconductor layer 10. Therefore, a gate-source capacitance (Cgsp) of the parasitic capacitance region becomes larger than that of the third embodiment. Therefore, an effective gate-drain capacitance (Cgd') of the MOSFET 500 becomes larger than that of the third embodiment.

According to the MOSFET 500 of the fifth embodiment, electromagnetic wave noise at the time of a switching operation can be suppressed while a decrease in a switching operation speed is suppressed by providing the parasitic capacitance region, similarly to the third embodiment. Further, the effective gate-drain capacitance (Cgd') can be increased by including the eighth gate region 32h and the ninth gate region 32i on the semiconductor layer 10. Therefore, electromagnetic wave noise at the time of a switching operation can be further suppressed than the third embodiment.

In the embodiments, the case in which the semiconductor layer 10 is made of silicon has been described as an example. However, the semiconductor layer 10 may be another semiconductor such as an SiC or GaN-based semiconductor.

Further, in the embodiments, the case in which the first conductivity type is the p type and the second conductivity type is the n type has been described as an example. However, the first conductivity type may be the n type and the second conductivity type may be the p type. In that case, the MOSFET is a p-type MOSFET having holes as carriers.

In addition, in the embodiment, the structure in which the well region 20 and the contact region 24 on the p pillar region 16 arranged in the y direction (second direction) are thinned out every other one p pillar region has been described as an example. However, the frequency of thinning out of the well region 20 and the contact region 24 on the p pillar region 16 is not limited to every other one p pillar region. For example, the well region 20 and the contact region 24 on the p pillar region 16 may be thinned out at a rate of one per every three pillars. Alternatively, the well region 20 and the contact region 24 on the two adjacent p pillar regions 16 may be thinned out. The frequency of thinning out of the well region 20 and the contact region 24 on the p pillar region 16 may be set to an appropriate frequency from the viewpoint of reduction of the on-resistance of the MOSFET and suppression of electromagnetic wave noise.

While several embodiments of the present disclosure have been described. However, these embodiments have been presented as examples and are not intended to limit the scope of the disclosure. These novel embodiments can be implemented in various other forms, and various omissions, replacements, and changes can be made without departing from the spirit of the disclosure. For example, a configuration element of one embodiment may be replaced or changed with a configuration element of another embodi-

What is claimed is:

1. A semiconductor device comprising:
a semiconductor layer having a first plane and a second plane;
a first semiconductor region of a first conductivity type provided in the semiconductor layer and extending in a first direction;
a second semiconductor region of a second conductivity type provided in the semiconductor layer and extending in the first direction;
a third semiconductor region of the second conductivity type provided in the semiconductor layer, extending in the first direction, and the first semiconductor region interposed between the third semiconductor region and the second semiconductor region;
a first well region of the first conductivity type provided between the first semiconductor region and the first plane, and having higher first conductivity-type impurity concentration than the first semiconductor region;
a second well region of the first conductivity type provided between the first semiconductor region and the first plane, having higher first conductivity-type impurity concentration than the first semiconductor region, and separated from the first well region in the first direction;
a first source region of the second conductivity type provided between the first well region and the first plane;
a second source region of the second conductivity type provided between the first well region and the first plane;
a first contact region of the first conductivity type provided between the first well region and the first plane and provided between the first source region and the second source region, and having higher first conductivity-type impurity concentration than the first well region;
a third source region of the second conductivity type provided between the second well region and the first plane;
a fourth source region of the second conductivity type provided between the second well region and the first plane;
a second contact region of the first conductivity type provided between the second well region and the first plane and provided between the third source region and the fourth source region, and having higher first conductivity-type impurity concentration than the second well region;
a gate electrode having a first gate region, a second gate region, a third gate region, a fourth gate region, and a fifth gate region, and extending in the first direction, the first gate region being provided on the first well region between the second semiconductor region and the first source region, the second gate region being provided on the first well region between the third semiconductor region and the second source region, the third gate region being provided on the second well region between the second semiconductor region and the third source region, the fourth gate region being provided on the second well region between the third semiconductor region and the fourth source region, and the fifth gate region being provided on the first semiconductor region between the first well region and the second well region;
a first insulating film provided between the first gate region and the first well region;
a second insulating film provided between the second gate region and the first well region;
a third insulating film provided between the third gate region and the second well region;
a fourth insulating film provided between the fourth gate region and the second well region;
a fifth insulating film provided between the fifth gate region and the first semiconductor region;
a source electrode having a first region and a second region, the first region being in contact with the first source region, the second source region, and the first contact region, and the second region being in contact with the third source region, the fourth source region, and the second contact region;
a drain electrode in contact with the second plane; and
a fourth semiconductor region of the first conductivity type provided in the semiconductor layer, extending in the first direction, and the second semiconductor region interposed between the fourth semiconductor region and the first semiconductor region;
a fifth semiconductor region of the first conductivity type provided in the semiconductor layer, extending in the first direction, and the third semiconductor region interposed between the fifth semiconductor region and the first semiconductor region;
a third well region of the first conductivity type provided between the fourth semiconductor region and the first plane, extending in the first direction, and having higher first conductivity-type impurity concentration than the fourth semiconductor region;
a fourth well region of the first conductivity type provided between the fifth semiconductor region and the first plane, extending in the first direction, and having higher first conductivity-type impurity concentration than the fifth semiconductor region;
a fifth source region of the second conductivity type provided between the third well region and the first plane; and
a sixth source region of the second conductivity type provided between the fourth well region and the first plane, wherein
the fifth insulating film is provided between the fifth gate region and the third well region, and
the fifth insulating film is provided between the fifth gate region and the fourth well region.

2. The semiconductor device according to claim 1, wherein
the first semiconductor region and the second semiconductor region, the first semiconductor region and the third semiconductor region, the second semiconductor region and the fourth semiconductor region, and the third semiconductor region and the fifth semiconductor region are in contact with each other.

3. The semiconductor device according to claim 1, wherein
the semiconductor layer is single crystal silicon.

4. The semiconductor device according to claim 1, wherein
the first conductivity type is a p type and the second conductivity type is an n type.

* * * * *